United States Patent
Bae et al.

(10) Patent No.: US 12,268,073 B2
(45) Date of Patent: Apr. 1, 2025

(54) LIGHT EMITTING AREA INCLUDING DIFFRACTIVE PATTERN AND DISPLAY DEVICE HAVING THE SAME

(71) Applicant: Samsung Display Co., Ltd., Yongin-si (KR)

(72) Inventors: Kwang Soo Bae, Yongin-si (KR); Minjeong Oh, Gimpo-si (KR); Beomsoo Park, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 310 days.

(21) Appl. No.: 17/225,553

(22) Filed: Apr. 8, 2021

(65) Prior Publication Data

US 2022/0013586 A1    Jan. 13, 2022

(30) Foreign Application Priority Data

Jul. 8, 2020    (KR) .................... 10-2020-0083821

(51) Int. Cl.
*H10K 59/38*    (2023.01)
*G09F 9/30*    (2006.01)
*H10K 50/86*    (2023.01)

(52) U.S. Cl.
CPC ............. *H10K 59/38* (2023.02); *G09F 9/301* (2013.01); *H10K 50/865* (2023.02)

(58) Field of Classification Search
CPC ...... H10K 50/865; H10K 50/86; H10K 59/38; H10K 59/8791; H10K 59/8792
See application file for complete search history.

(56) References Cited

U.S. PATENT DOCUMENTS

| | | | |
|---|---|---|---|
| 7,649,596 B2 | 1/2010 | Rho | |
| 10,847,586 B2 | 11/2020 | Lee | |
| 10,903,284 B2 | 1/2021 | Lee et al. | |
| 11,233,224 B2 | 1/2022 | Eom et al. | |
| 2015/0362793 A1* | 12/2015 | Ishihara | G02F 1/133512 257/40 |
| 2016/0043145 A1* | 2/2016 | Choi | H10K 50/844 257/40 |
| 2016/0064694 A1* | 3/2016 | Choi | H10K 50/865 257/40 |
| 2018/0301664 A1* | 10/2018 | Ahn | G02F 1/133524 |
| 2019/0094450 A1* | 3/2019 | Bae | G02B 6/0053 |

(Continued)

FOREIGN PATENT DOCUMENTS

| | | |
|---|---|---|
| KR | 10-0544327 B1 | 1/2006 |
| KR | 1020060118153 A | 11/2006 |
| KR | 20160017397 A | 2/2016 |

(Continued)

*Primary Examiner* — Nicholas J Tobergte
*Assistant Examiner* — Adin Hrnjic
(74) *Attorney, Agent, or Firm* — CANTOR COLBURN LLP

(57) ABSTRACT

A display device includes a display panel including a peripheral region adjacent to a light-emitting region, and a reflection preventing facing the display panel. The reflection preventing layer includes a light-blocking pattern corresponding to the peripheral region and defining an opening corresponding to the light-emitting region, a color filter in the opening of the light-blocking pattern, and a protruding pattern corresponding to the light-blocking pattern.

13 Claims, 14 Drawing Sheets

(56) References Cited

U.S. PATENT DOCUMENTS

2019/0341428 A1    11/2019  Lee et al.
2020/0028114 A1*    1/2020  Zhai ...................... H10K 59/12

FOREIGN PATENT DOCUMENTS

| KR | 20180133024 A   | 12/2018 |
| KR | 1020190128010 A | 11/2019 |
| KR | 20200039057 A   | 4/2020  |
| KR | 20200039859 A   | 4/2020  |

* cited by examiner

LIGHT EMITTING AREA INCLUDING DIFFRACTIVE PATTERN AND DISPLAY DEVICE HAVING THE SAME

This application claims priority to Korean Patent Application No. 10-2020-0083821, filed on Jul. 8, 2020, and all the benefits accruing therefrom under 35 U.S.C. § 119, the entire contents of which are hereby incorporated by reference.

BACKGROUND

(1) Field

The disclosure herein relates to a display device, and more particularly, to a display device having improved visibility by reducing external light reflection.

(2) Description of the Related Art

Display devices that provide images, such as televisions, display monitors, smartphones and tablet computers each include a display panel for displaying an image. Various display panels such as a liquid crystal display panel, an organic light-emitting display panel, an electrowetting display panel and an electrophoretic display panel have been developed as display panels.

SUMMARY

The disclosure provides a display device having improved visibility by reducing external light reflection.

The disclosure also provides a display device having improved visibility by reducing or effectively preventing external light incident at a predetermined angle from being reflected by an electrode or the like without decreasing transmittance of a display region.

An embodiment provides a display device including a display panel including a light-emitting region and a peripheral region which is adjacent to the light-emitting region, and a reflection preventing layer facing the display panel. The reflection preventing layer includes a light-blocking pattern corresponding to the peripheral region and defining an opening corresponding to the light-emitting region, a color filter in the opening of the light-blocking pattern, and a protruding pattern corresponding to the light-blocking pattern.

In an embodiment, the protruding pattern may be a diffractive pattern which diffracts at least a portion of external light.

In an embodiment, the diffractive pattern may have a trapezoidal shape in a cross-sectional view.

In an embodiment, the reflection preventing layer may further include a protective layer on the diffractive pattern and the color filter, and a refractive index of the diffractive pattern may be greater than a refractive index of the protective layer.

In an embodiment, the diffractive pattern may include a first diffractive pattern at least a portion of which overlaps the light-blocking pattern, and a second diffractive pattern overlapping the opening.

In an embodiment, the second diffractive pattern may include: a first sub diffractive pattern overlapping the peripheral region, and a second sub diffractive pattern overlapping the light-emitting region.

In an embodiment, an interval between the first sub diffractive pattern and the second sub diffractive pattern and an interval between the first sub diffractive pattern and the first diffractive pattern may be substantially same.

In an embodiment, a width of the first diffractive pattern may be greater than a width of the second diffractive pattern.

In an embodiment, the first diffractive pattern may cover a border between the light-blocking pattern and the opening in a plan view.

In an embodiment, the protruding pattern may protrude from the color filter.

In an embodiment, the protruding pattern may include a same material as the color filter.

In an embodiment, the protruding pattern may have an integrated shape with the color filter.

In an embodiment, the protruding pattern may have a semi-circular shape in a cross-sectional view.

In an embodiment, the protruding pattern may have a shape embedded in an upper surface of the color filter in a direction toward the light-blocking pattern.

In an embodiment, the display device may further include an input sensing layer between the display panel and the reflection preventing layer. The light-blocking pattern may be in contact with the input sensing layer.

In an embodiment, a portion of the color filter inside the peripheral region may overlap the light-blocking pattern, and the protruding pattern may be on the portion of the color filter.

In an embodiment, the display device may include a folding region having a folding axis about which the display device is foldable.

In an embodiment, a display device includes: a display panel including a plurality of light-emitting regions which respectively emit different color lights, and a peripheral region adjacent to the plurality of light-emitting regions, and in order from the display panel a light-blocking pattern defining openings respectively corresponding to the plurality of light-emitting regions, a color filter layer including a plurality of color filters respectively in the openings, each of the plurality of color filters extended from a respective opening among the openings to define a portion of a respective color filter among the plurality of color filters which corresponds to the light-blocking pattern, and a protruding pattern corresponding to both the light-blocking pattern and the portion of the respective color filter.

In an embodiment, the light-blocking pattern and the respective opening may have a border therebetween, the plurality of light-emitting regions may have a border therebetween, and the protruding pattern may be provided in plural including a first protruding pattern extended along the border between the light-blocking pattern and the respective opening, a second protruding pattern extended along the border between the plurality of light-emitting regions, and a third protruding pattern further from the first protruding pattern than the second protruding pattern.

In an embodiment, the portion of the respective color filter may extend to define the protruding pattern.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain embodiments of the invention. In the drawings.

DETAILED DESCRIPTION

Figure 1A:
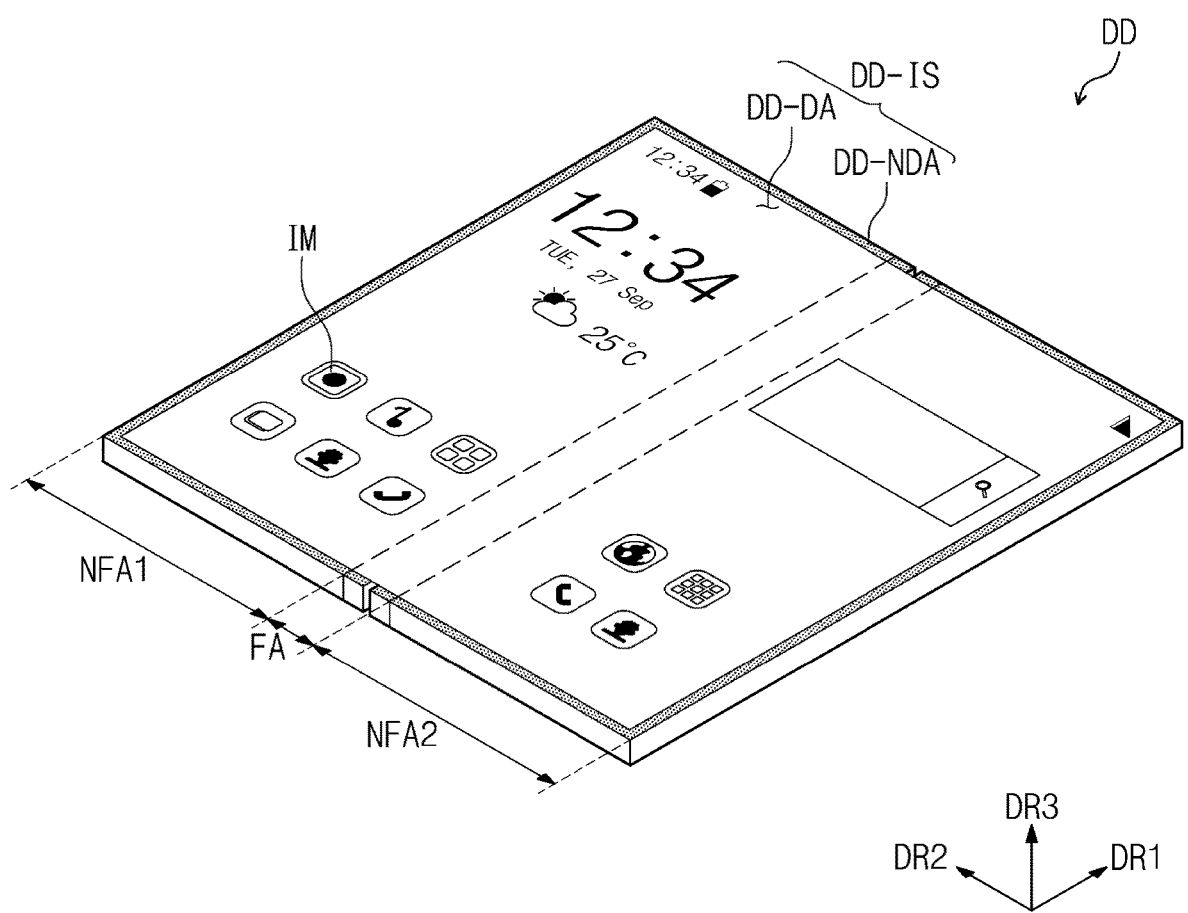
FIGS. 1A to 1C are perspective views of an embodiment of a display device.

In this specification, it will be understood that when an element (or a region, a layer, portion, etc.) is referred to as being related to another element such as being "on," "connected to" or "coupled to" another element or layer, it can be directly on, connected or coupled to the other element, or a third intervening element may be present therebetween.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference symbols refer to like elements. Also, in the figures, the thicknesses, the ratios and the dimensions of elements are exaggerated for effective illustration of technological contents.

Although the terms such as "first" and "second" may be used herein to describe various elements, these elements should not be limited by these terms. The terms are only used to distinguish one element from other elements. For example, without departing from the scope of the invention, a first element may be referred to as a second element, and similarly, the second element may also be referred to as the first element. Singular forms may include plural forms unless clearly defined otherwise in context.

In addition, terms such as "under," "below," "on" and "above" may be used to describe the relationship between features illustrated in the figures. The terms have relative concepts, and are described with respect to directions illustrated in the figures.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It should be further understood that the terms "includes" or "has", when used in this specification, specify the presence of stated features, numbers, steps, operations, elements, components or combinations thereof, but do not preclude the presence or addition of one or more other features, numbers, steps, operations, elements, components, and/or combinations thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless defined otherwise, all terms (including technical terms and scientific terms) used in this specification have the same meaning as that generally understood by those skilled in the art to which the invention belongs. It will be further understood that terms, such as those defined in commonly used dictionaries, should be interpreted as having a meaning that is consistent with their meaning in the context of the relevant art and will not be interpreted in an idealized or overly formal sense unless so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

In display devices, a reflection phenomenon may occur due to natural light as external light. Such a reflection phenomenon degrades visibility of display devices. An optical film may be used in display devices to prevent the reflection phenomenon.

Hereinafter, embodiments will be described with reference to the accompanying drawings.

Figure 1B:
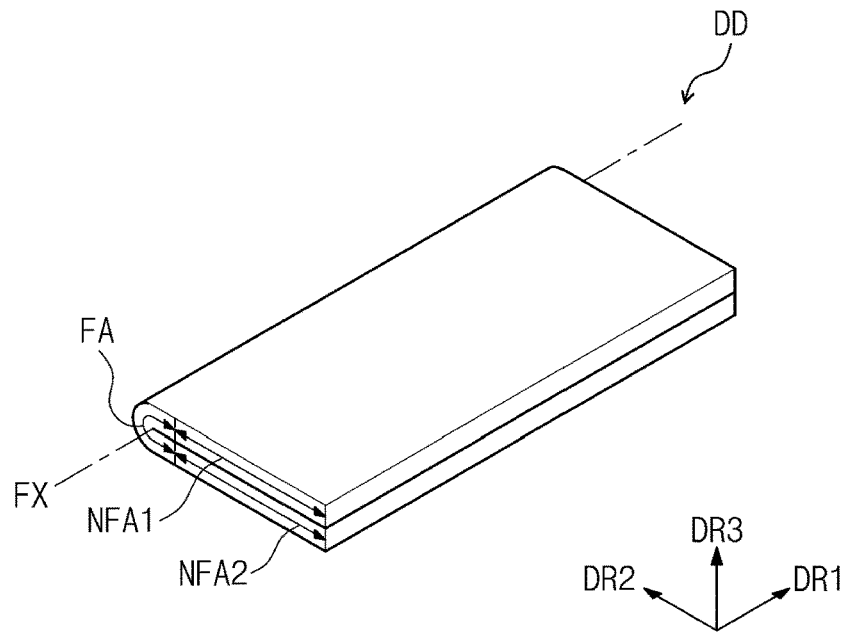
Figure 1C:
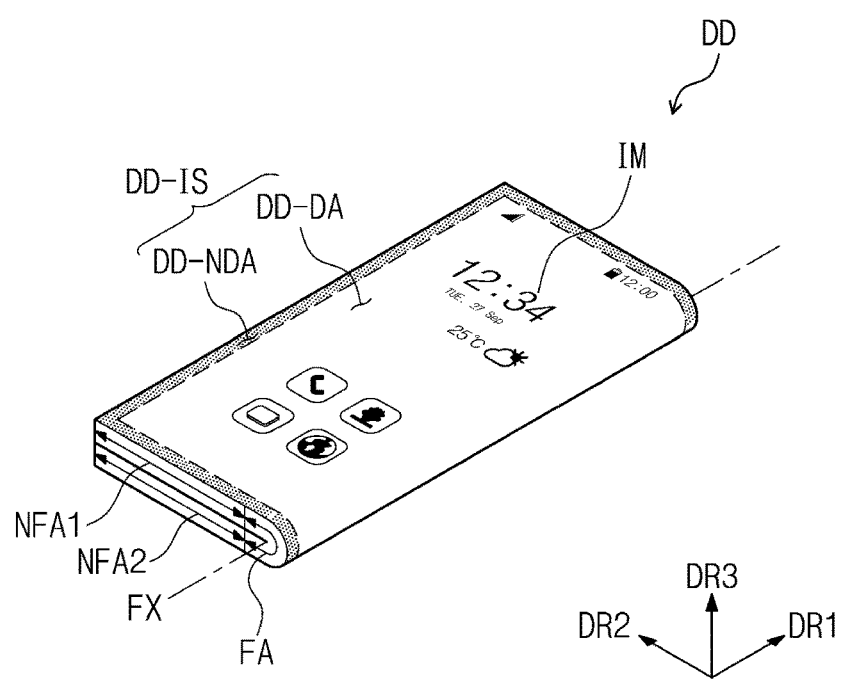

FIGS. 1A to 1C are perspective views of an embodiment of a display device DD.

As illustrated in FIGS. 1A to 1C, in a display device DD, a display surface DD-IS is parallel to a plane defined by a first direction DR1 and a second direction DR2 which cross each other. The normal direction of the display surface DD-IS, that is, the thickness direction of the display device DD, is indicated by a third direction DR3 which crosses each of the first direction DR1 and the second direction DR2. The front surface (or upper surface) and the rear surface (or lower surface) of each of members are distinguished with respect to the third direction DR3. Hereinafter, the various directions are directions respectively indicated by the first to third directions DR1, DR2 and DR3, and are referred to as the same reference symbols.

As illustrated in FIGS. 1A to 1C, the display surface DD-IS includes a display region DD-DA (e.g., display area) in which an image IM is displayed, and a non-display region DD-NDA (e.g., non-display area) which is adjacent to the display region DD-DA. The non-display region DD-NDA is a planar area in which no image IM is displayed. FIGS. 1A to 1C illustrate icon images as examples of the image IM. In an embodiment, for instance, the display region DD-DA may have a rectangular planar shape. The non-display region DD-NDA may surround the display region DD-DA. However, the invention is not limited thereto, and the planar shapes of the display region DD-DA and the non-display region DD-NDA may be varied.

As illustrated in FIGS. 1A to 1C, the display device DD may include a plurality of regions defined according to operations of the display device DD. The display device DD may include a folding region FA (e.g., folding area) at which the display device DD and various components thereof are foldable with respect to a folding axis FX, a first planar region NFA1 (e.g., first non-folding area) adjacent to the folding region FA, and a second planar region NFA2 (e.g., second non-folding area). The display device DD which is folded at the folding region FA defines a curvature of the display device DD at the folding region FA. A non-folding area may be a planar area at which the display device DD and various components thereof are not foldable or which remain flat even when the display device DD is folded at the folding region FA.

The embodiment illustrates the display device DD in which the folding axis FX is parallel to the longitudinal axis of the display device DD. However, the invention is not limited thereto, and the folding axis FX may also be parallel to the short axis of the display device DD. Furthermore, in an embodiment, the display device DD may have a bar shape that is not foldable.

As illustrated in FIG. 1B, the display device DD may be in-folded so that portions of the display surface DD-IS at the first planar region NFA1 and the second planar region NFA2 face each other. As illustrated in FIG. 1C, the display device DD may also be out-folded so that portions of the display surface DD-IS are exposed to outside the display device DD and face away from each other. As illustrated in FIGS. 1A to 1C, a display module in which folding and unfolding are repeatedly performed may be defined as a foldable display module.

In an embodiment, the display device DD may include a plurality of folding regions FA. Furthermore, the folding region FA may be defined corresponding to the form into which the display device DD is deformed. In an embodiment, for example, in a plan view, the folding region FA may also be defined along a diagonal direction inclined relative to each of the first direction DR1 and the second direction DR2. The planar area of the folding region FA may not be fixed but determined according to curvatures of radius formed by the display device DD which is deformed. In an embodiment, the display device DD may be repeatedly deformed according to the structures illustrated in FIGS. 1A and 1B, and/or may also be repeatedly deformed according to the structures illustrated in FIGS. 1A and 1C.

While the display device DD applied to a mobile phone is illustrated, the invention is not limited thereto. In an embodiment, the display device DD may be applied to large-sized electronic devices such as televisions and display monitors, and small and medium-sized electronic devices such as tablet computers, vehicle navigation devices, game machines and smart watches.

FIGS. 2A to 2D are cross-sectional views of embodiments of a display device DD. FIGS. 2A to 2D illustrate cross-sections defined by the second direction DR2 and the third direction DR3. The display devices DD of FIGS. 2A to 2D are simply illustrated in order to describe the stacking relationship between functional panels and/or functional units constituting the display device DD.

The display device DD may include a display panel DP, an input sensor, a reflection preventing member and a window WP. In an embodiment, the input sensor may not be provided. Structures of one or more among the display panel DP, the input sensor, the reflection preventing member and the window WP may be provided or formed by a continuous process relative to a base (e.g., without an intervening bonding member therebetween), and other structures may be coupled to each other via one or more bonding members such as adhesive members. In FIGS. 2A to 2D, a pressure sensitive adhesive film PSA is illustrated as an adhesive members. Adhesive members described below may each include a general adhesive or a sticking agent, and the invention is not limited thereto.

In FIGS. 2A to 2D, a structure provided or formed through a continuous process relative to another structure among the input sensor, the reflection preventing member and the window WP is expressed a "layer." The structure coupled via an adhesive member to another structure among the input sensor, the reflection preventing member and the window WP will be expressed as a "panel." The panel includes a base layer, such as a synthetic resin film, a composite material film or a glass substrate, that provides a base surface from which continuous processes are performed, but the term "layer" may not include the base layer used in the panel. In other words, the member or structure expressed as "layer" is disposed on a base surface provided by another member or structure.

The panel may include an input sensing panel ISP or a reflection preventing panel RPP according to the presence or absence of the input sensor and the reflection preventing unit base layer. In an embodiment, "panel" types are applied to all windows, but the invention is not limited thereto.

Figure 2A:
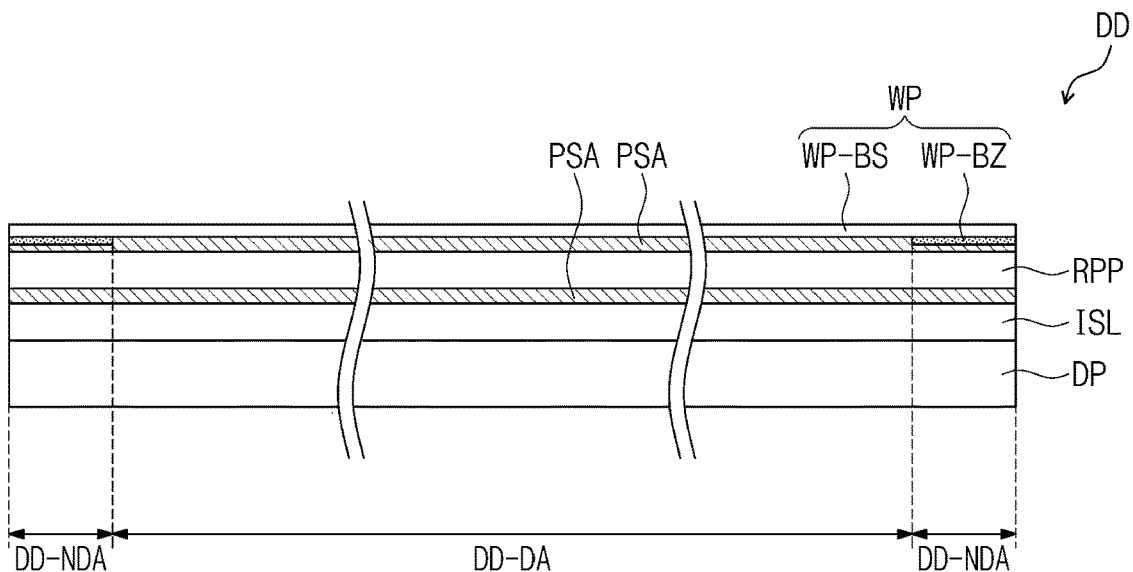
FIGS. 2A to 2D are cross-sectional views of embodiments of a display device.

As illustrated in FIG. 2A, the display device DD may include a display panel DP, an input sensing layer ISL, a reflection preventing panel RPP and a window WP. In the display device DD, a coupled structure of the various layers except for the window WP may be defined as a display module.

The input sensing layer ISL may be directly on the display panel DP. In this specification, the statement "structure B1 is disposed directly on structure A1" means that no intervening member such as an adhesive member is disposed between structure A1 and structure B1. In an embodiment of elements being direction on each other, after structure A1 is provided or formed, structure B1 is provided or formed through a continuous process on a base surface provided by structure A1. A pressure sensitive adhesive film PSA is disposed between the reflection preventing panel RPP and the window WP and between the input sensing layer ISL and the reflection preventing panel RPP.

The display panel DP generates and displays an image IM, and the input sensing layer ISL obtains coordinate information of an external input (for example, a touch event) to the display device DD. Although not shown, a protective member may further be disposed under the display panel DP, that is, facing the input sensing layer ISL with the display panel DP therebetween. The protective member supports the display panel DP and protects the display panel DP from an external shock. The display panel DP may include pixels at which light is generated or emitted, an image is displayed, etc. The display panel DP may be a light-emitting display panel, but the invention is not limited thereto. In an embodiment, for example, the display panel DP may be an organic light-emitting display panel or a quantum dot light-emitting display panel. A light emission layer of the organic light-emitting display panel may include an organic light-emitting material. A light emission layer of the quantum dot light-emitting display panel may include quantum dots and/or quantum rods etc. Hereinafter, the display panel DP will be described as an organic light-emitting display panel.

The reflection preventing panel RPP decreases the reflectivity of natural light (or solar light) incident from above the window WP which is outside of the display device DD. The reflection preventing panel RPP includes a base layer and color filters. The color filters are arranged in a predetermined array. The arrays of the color filters may be determined considering light-emitting colors of pixels included in the display panel DP. The reflection preventing panel RPP may further include a black matrix as a light-blocking pattern which is adjacent to the color filters.

The window WP includes a base substrate WP-BS and a light-shielding pattern WP-BZ. The base substrate WP-BS may have a multilayer structure. The base substrate WP-BS may include a glass substrate or a synthetic resin film.

Figure 2B:
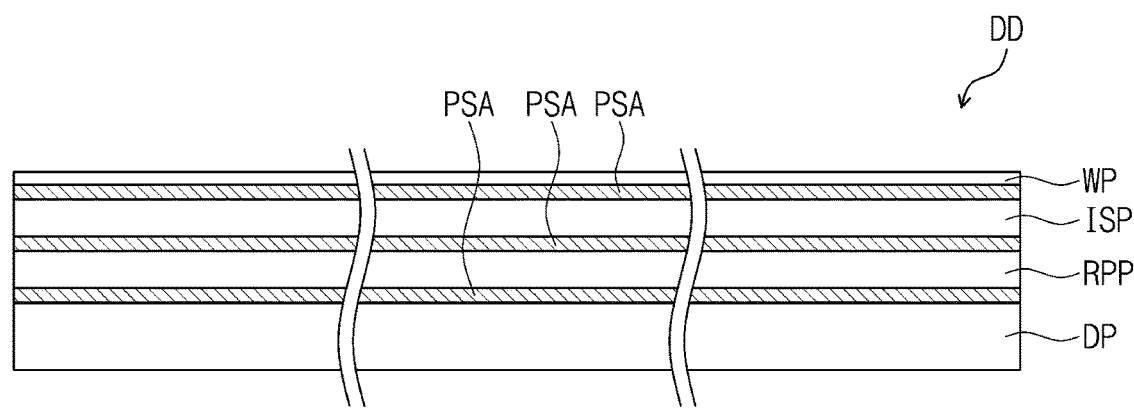
Figure 2C:
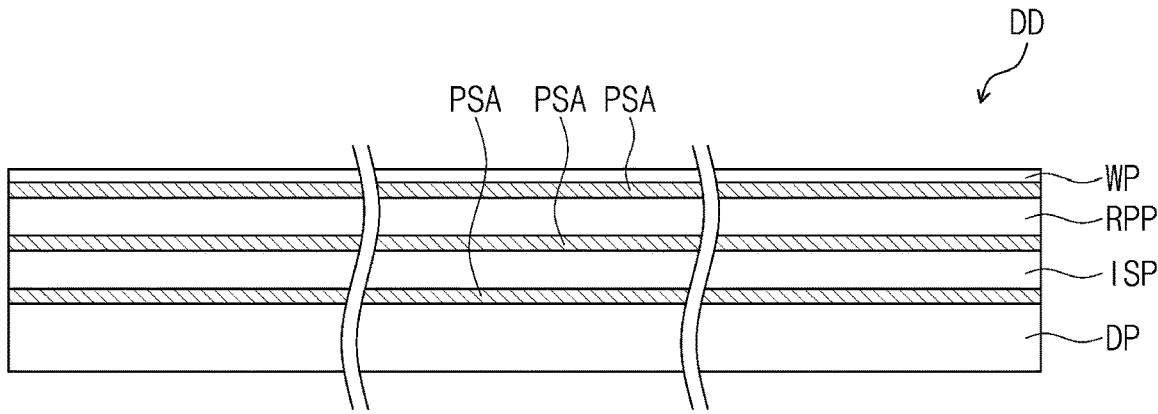
Figure 2C:
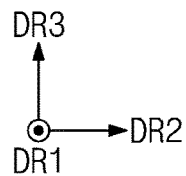
Figure 2D:
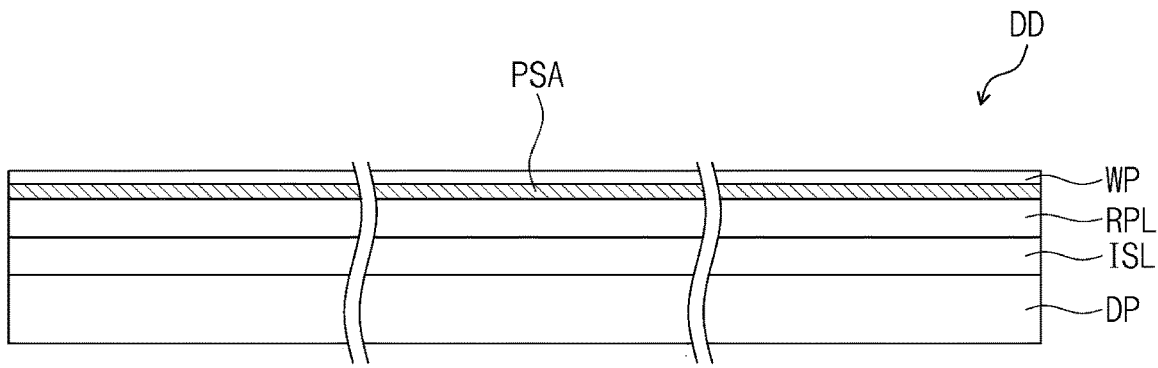
Figure 2D:
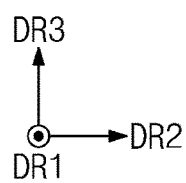

The light-shielding pattern WP-BZ partially overlaps the base substrate WP-BS. The light shielding pattern WP-BZ is disposed on a rear surface of the base substrate WP-BS which is closest to the display panel DP and may define a bezel region of the display device DD, that is, the non-display region DD-NDA (see FIG. 1). The light shielding pattern WP-BZ may be a colored organic film and may be provided or formed through, for example, a coating method. In FIGS. 2B to 2D, the window WP is simply illustrated without distinguishing the base substrate WP-BS and the light-shielding pattern WP-BZ.

In an embodiment, the light-shielding pattern WP-BZ may be excluded. In an embodiment, the light-shielding pattern WP-BZ may be provided on the reflection preventing panel RPP. In an embodiment, the light-shielding pattern WP-BZ may be disposed on another optical member or another synthetic resin film, and disposed under the window WP.

As illustrated in FIGS. 2B and 2C, the display device DD may include a display panel DP, a reflection preventing panel RPP, an input sensing panel ISP and a window WP. The stacking order of the input sensing panel ISP and the reflection preventing panel RPP may be variously changed.

As illustrated in FIG. 2D, the display device DD may include a display panel DP, an input sensing layer ISL, a reflection preventing layer RPL and a window WP. With "layers" instead of "panels," the adhesive members are mostly omitted from the display device DD, and the input sensing layer ISL and the reflection preventing layer RPL may be provided or formed through a continuous process relative to a base surface provided by the display panel DP. The stacking order of the input sensing layer ISL and the reflection preventing layer RPL may be variously changed.

In an embodiment, the reflection preventing layer RPL may include color filters. Detailed description on the reflection preventing layer RPL will be described later.

Figure 3:
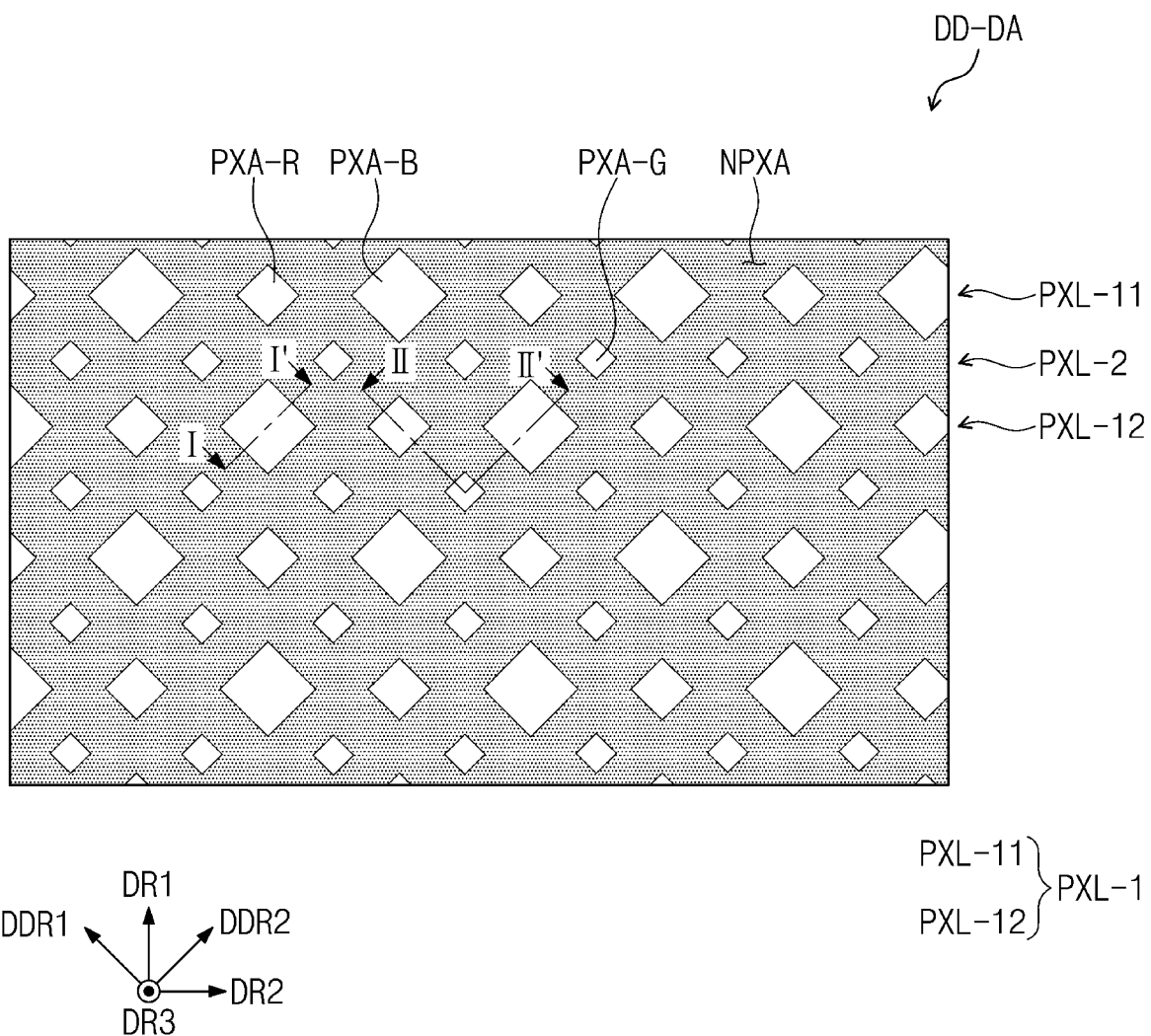
FIG. 3 is a plan view of an embodiment of a display region.

FIG. 3 is a plan view of an embodiment of a display region DD-DA.

Referring to FIG. 3, a plurality of light-emitting regions PXA-R, PXA-G and PXA-B are disposed in the display region DD-DA. A peripheral region NPXA is disposed adjacent to the plurality of light-emitting regions PXA-R, PXA-G and PXA-B. The peripheral region NPXA forms borders between the plurality of light-emitting regions PXA-R, PXA-G and PXA-B and reduces or effectively prevents color mixing between the plurality of light-emitting regions PXA-R, PXA-G and PXA-B. The plurality of light-emitting regions PXA-R, PXA-G and PXA-B may define a plurality of pixel rows PXL-1 and PXL-2 extending along the second direction DR2. In FIG. 3, the second direction DR2 is defined as the extension direction (or row direction) of the pixel rows PXL-1 and PXL-2 and the first direction DR1 may be defined as the column direction DR1.

In an embodiment, the plurality of pixel rows PXL-1 and PXL-2 may be divided into two groups. The pixel rows PXL-1 of a first group may include a first-color light-emitting region PXA-R (hereinafter, a first color region PXA-R) that generates and/or emits a first color light and is provided in plural including first color regions PXA-R and a second-color light-emitting region PXA-B (hereinafter, a second color region PXA-B) that generates and/or emits a second color light and is provided in plural including second color regions PXA-B. First color regions PXA-R may be alternately disposed along the second direction DR2 together with second color regions PXA-B. The pixel rows PXL-1 of the first group may include a first pixel row PXL-11 and a second pixel row PXL-12. The first pixel rows PXL-11 and the second pixel rows PXL-12 may be alternately disposed along the column direction DR1.

In the first pixel row PXL-11 and the second pixel row PXL-12, the disposition order of the first color regions PXA-R and the second color regions PXA-B may be different from each other. In the column direction DR1, the first color region PXA-R of the first pixel row PXL-11 and the second color region PXA-B of the second pixel row PXL-12 are aligned along the column direction DR1, and the second color region PXA-B of the first pixel row PXL-11 and the first color region PXA-R of the second pixel row PXL-12 may be aligned along the column direction DR1.

The pixel row PXL-2 may be provided in plurality in the second group. The pixel rows PXL-2 of the second group may include a third-color light-emitting region PXA-G (hereinafter, third color region PXA-G) that generates and/or emits a third color light and is provide in plural including third color regions PXA-G.

The pixel rows PXL-1 of the first group and the pixel rows PXL-2 of the second group may be alternately disposed along the column direction DR1. The pixel row PXL-2 of the second group may be disposed between the first pixel row PXL-11 and the second pixel row PXL-12 that are consecutive along the column direction DR1, and either the first pixel row PXL-11 or the second pixel row PXL-12 may be disposed between the pixel rows PXL-2 of the second group which are in order along the column direction DR1.

It is illustrated that the first-color light-emitting region PXA-R, the second-color light-emitting region PXA-B and the third-color light-emitting region PXA-G which have mutually different planar areas and/or shapes in a plan view, but the invention is not limited thereto. It is illustrated that among the light-emitting regions PXA-R, PXA-G and PXA-B, the planar area of the second-color light-emitting region PXA-B is the largest, and the planar area of the third-color light-emitting region PXA-G is the smallest, but this is merely an example. In addition, it is illustrated that the first-color light-emitting region PXA-R, the second-color light-emitting region PXA-B and the third-color light-emitting region PXA-G all have square planar shapes, but the invention is not limited thereto. In an embodiment, for example, any one among the first-color light-emitting region PXA-R, the second-color light-emitting region PXA-B and the third-color light-emitting region PXA-G may have a planar shape such as a rectangular shape, a rectangular shape with rounded corners, or a square shape with rounded corners.

In an embodiment, the first-color light-emitting region PXA-R may generate red light, the second-color light-emitting region PXA-B may generate blue light, and the third-color light-emitting region PXA-G may generate green light. However, the invention is not limited thereto. The colored light respectively emitted by the first-color light-emitting region PXA-R, the second-color light-emitting region PXA-B and the third-color light-emitting region PXA-G may be a combination of the three color lights that may generate white light by a mixture of the respectively emitted colored light.

Figure 4:
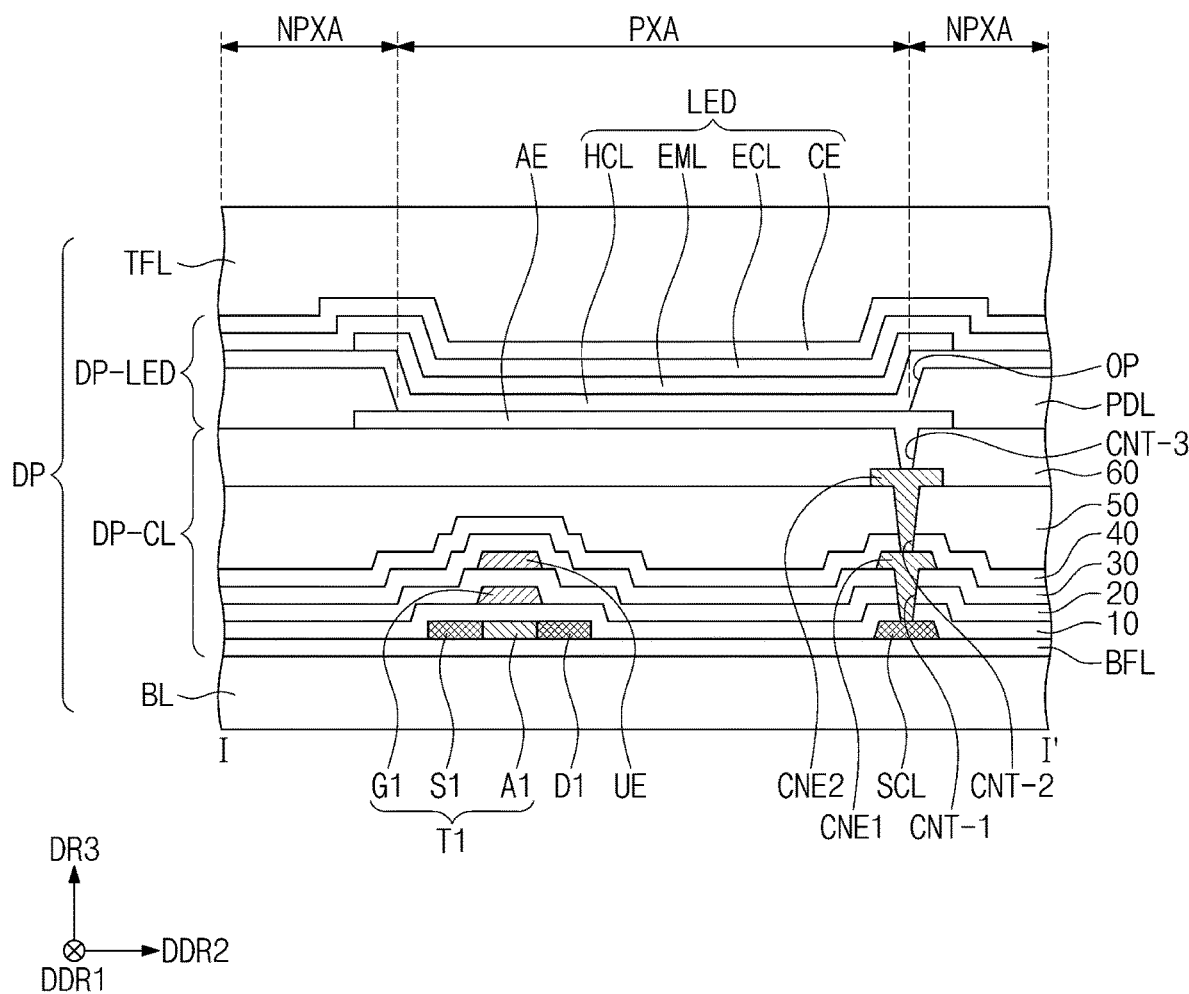
FIG. 4 is an enlarged cross-sectional view of an embodiment of a display panel.

FIG. 4 is a cross-sectional view of an embodiment of a display panel DP. FIG. 4 illustrates a cross-section taken along line I-I' of FIG. 3. FIG. 4 specifically illustrates the display panel DP described above with reference to FIGS. 2A to 2D. FIG. 4 illustrates a view along a first crossing direction DDR1 of a plane defined by a second crossing direction DDR2 and the third direction DR3 which is the thickness direction. Each of the first crossing direction DDR1 and the second crossing direction DDR2 may be inclined with respect to the first direction DR1 and the second direction DR2.

Referring to FIG. 4, a display panel DP may include a panel base layer BL, a circuit element layer DP-CL, a display element layer DP-LED and an upper insulating layer TFL. The stacking structure of the display panel DP is not particularly limited.

The display panel DP may include a plurality of insulating layers, a semiconductor pattern, a conductive pattern, signal lines and the like. The insulating layers, the semiconductor layer and the conductive layer are provided or formed through a method such as coating or deposition. The insulating layer, the semiconductor layer and the conductive layer may be selectively patterned such as by a photolithography method. Semiconductor patterns, conductive patterns, signal lines and the like, which are included in the circuit element layer DP-CL and the display element layer DP-LED, are provided or formed through such a method.

The panel base layer BL may include a synthetic resin film. The panel base layer BL may include a glass substrate, a metal substrate, an organic/inorganic composite material substrate, or the like.

At least one inorganic layer is disposed on the upper surface of the panel base layer BL. A buffer layer BFL improves the coupling power between the panel base layer BL and the semiconductor pattern. The buffer layer BFL may include a silicon oxide layer and a silicon nitride layer. The silicon oxide layer and the silicon nitride layer may be stacked in order from the panel base layer BL.

A semiconductor pattern is disposed on the buffer layer BFL and may be provided in plural including semiconductor patterns. The semiconductor pattern may include polysilicon. However, the invention is not limited thereto, and the semiconductor pattern may also include amorphous silicon or a metal oxide.

FIG. 4 illustrates only some semiconductor patterns, and semiconductor patterns may further be disposed in the plurality of light-emitting regions PXA-R, PXA-G and PXA-B (see FIG. 3) in a plan view. The semiconductor patterns may be aligned in the plurality of light-emitting regions PXA-R, PXA-G and PXA-B (see FIG. 3). The electrical properties of the semiconductor patterns are different according to a doping thereof. The semiconductor patterns may include a doping region and a non-doping region. The doping region may be doped with N-type dopants or P-type dopants. A P-type transistor includes a doping region doped with P-type dopants.

The doping region has greater conductivity than the non-doping region and may function as an electrode or a signal line. The non-doping region may substantially correspond to the active portion (or a channel) of a transistor element. In other words, a first portion of the semiconductor patterns may be the channel of a transistor element, and a second portion different from the first portion may be the source element or drain element of a transistor element, and a third portion different from the first and second portions may be a connecting electrode element or a connecting signal line element.

As illustrated in FIG. 4, a source Si, an active region A1, and a drain D1 of a transistor T1 are provided or formed from respective portions of a same semiconductor pattern. FIG. 4 illustrates a portion of a connecting signal line SCL provided or formed as a portion of a semiconductor pattern. Although not shown separately, the connecting signal line SCL may be connected to the drain D1 of the transistor T1 in a plan view.

A first insulating layer 10 to a sixth insulating layer 60 are disposed in order from the buffer layer BFL. The first insulating layer 10 to the sixth insulating layer 60 may include inorganic layers or organic layers. The gate G1 is disposed on the first insulating layer 10. An upper electrode UE may be disposed on the second insulating layer 20. A first connecting electrode CNE1 may be disposed on the third insulating layer 30. The first connecting electrode CNE1 may be connected to the connecting signal line SCL through a first contact hole CNT-1 passing through the first to third insulating layers 10 to 30. A second connecting electrode CNE2 may be disposed on the fifth insulating layer 50. The second connecting electrode CNE2 may be connected to the first connecting electrode CNE1 through a second contact hole CNT-2 passing through the fourth insulating layer 40 and the fifth insulating layer 50.

A light-emitting element LED and a pixel defining layer PDL are disposed on the sixth insulating layer 60. A first electrode AE is disposed on the sixth insulating layer 60. The first electrode AE may be connected to the second connecting electrode CNE2 through a third contact hole CNT-3 passing through the sixth insulating layer 60. The pixel defining layer PDL defines a light-emitting opening OP (hereinafter, light-emitting part or light emission area) at which light is emitted. The light-emitting opening OP may expose at least a portion of the first electrode AE.

In an embodiment, the pixel defining layer PDL may have a black color. The pixel defining layer PDL may include a black coloring agent. The pixel defining layer PDL may include a black dye and black pigment added to a base resin.

FIG. 4 illustrates a light-emitting region PXA and a peripheral region NPXA (or non-light-emitting region) which is adjacent to the light-emitting region PXA. The light-emitting region PXA may substantially be defined corresponding to a planar area of the first electrode AE which is exposed to outside the pixel defining layer PDL by the light-emitting opening OP thereof.

A hole control layer HCL may be commonly disposed in a light-emitting region PXA and a non-light-emitting region NPXA. The hole control layer HCL includes a hole transportation layer and may further include a hole injection layer. A emission layer EML is disposed on the hole control layer HCL. The emission layer EML may be disposed in the region corresponding to the light-emitting opening OP. That is, the emission layer EML may be provided or formed by being divided into patterns respectively corresponding to each of the light-emitting regions PXA-R, PXA-G and PXA-B.

An electron control layer ECL is disposed on the emission layer EML. The electron control layer ECL includes an electron transportation layer and may further include an electron injection layer. A second electrode CE is disposed on the electron control layer ECL.

The upper insulating layer TFL is disposed on the second electrode CE. The upper insulating layer TFL may include a plurality of thin films. In an embodiment, the upper insulating layer TFL may include a capping layer and a thin film sealing layer.

Figure 5A:
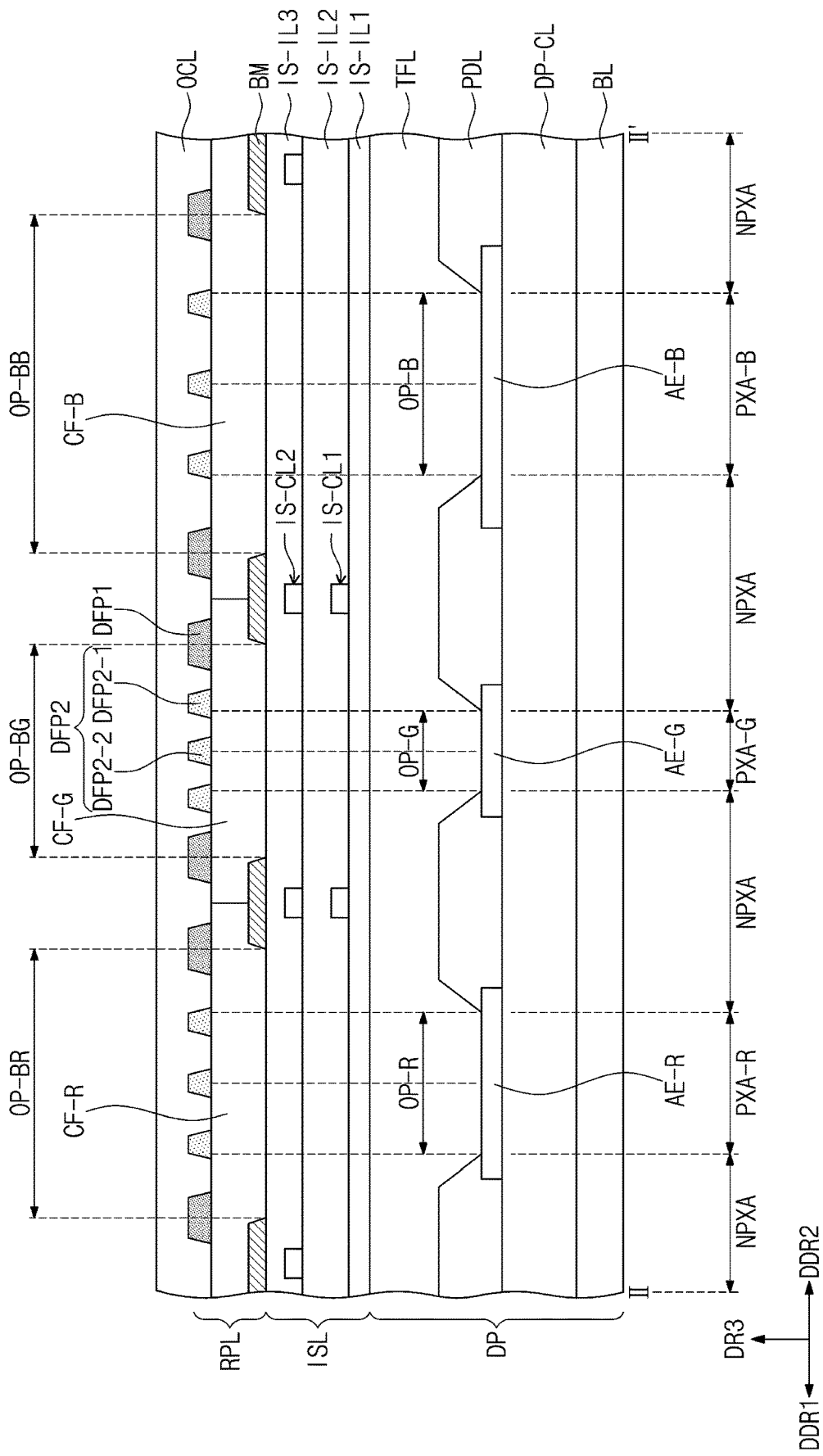
FIG. 5A is a cross-sectional view of embodiments of structures included in a display device.
Figure 5B:
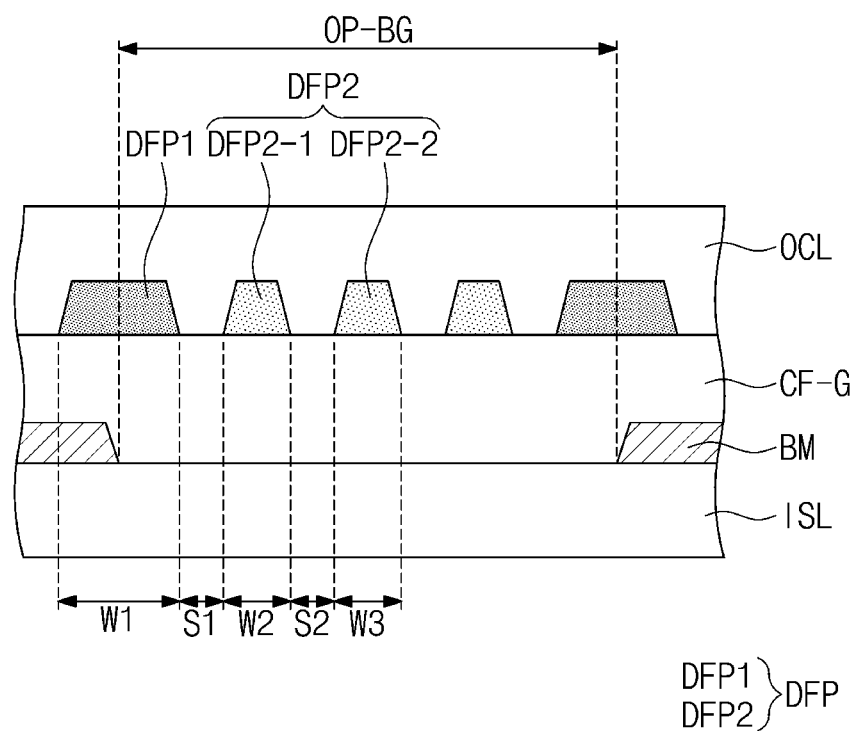
FIG. 5B is an enlarged cross-sectional view illustrating an embodiment of the structures illustrated in FIG. 5A.
Figure 5C:
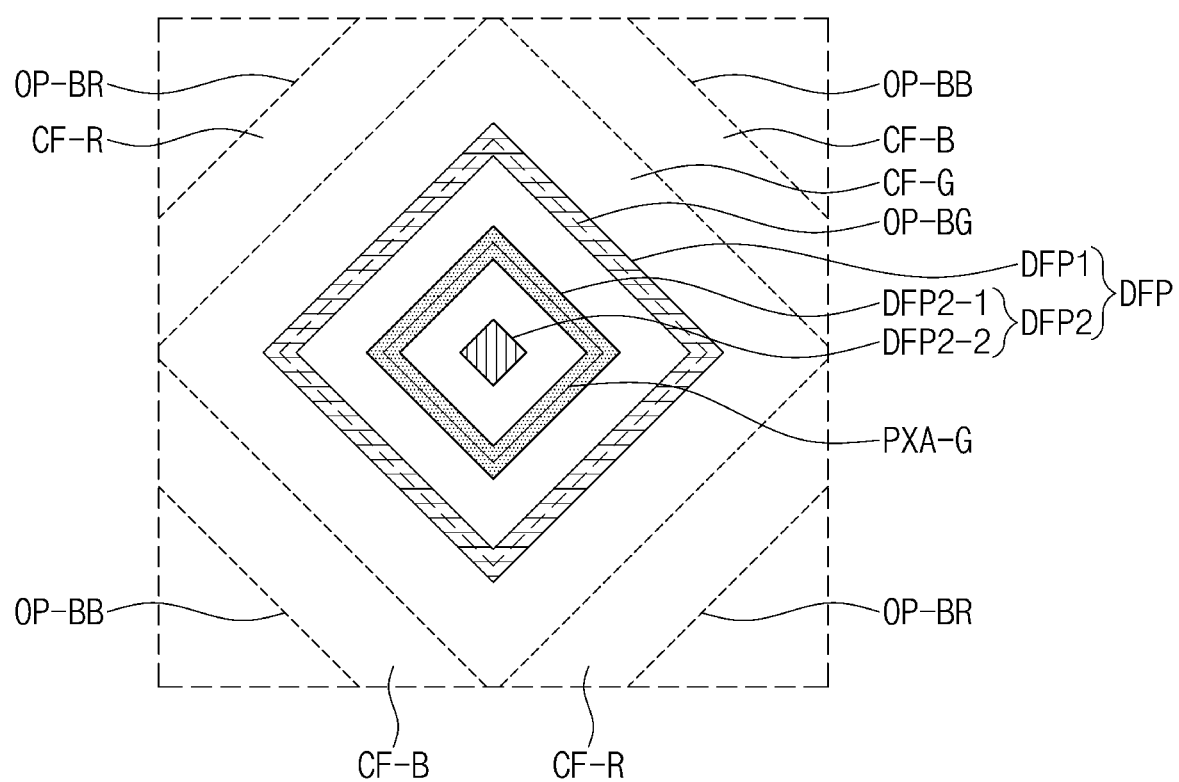
FIG. 5C is an enlarged plan view of an embodiment of a portion of a display device.
Figure 5D:
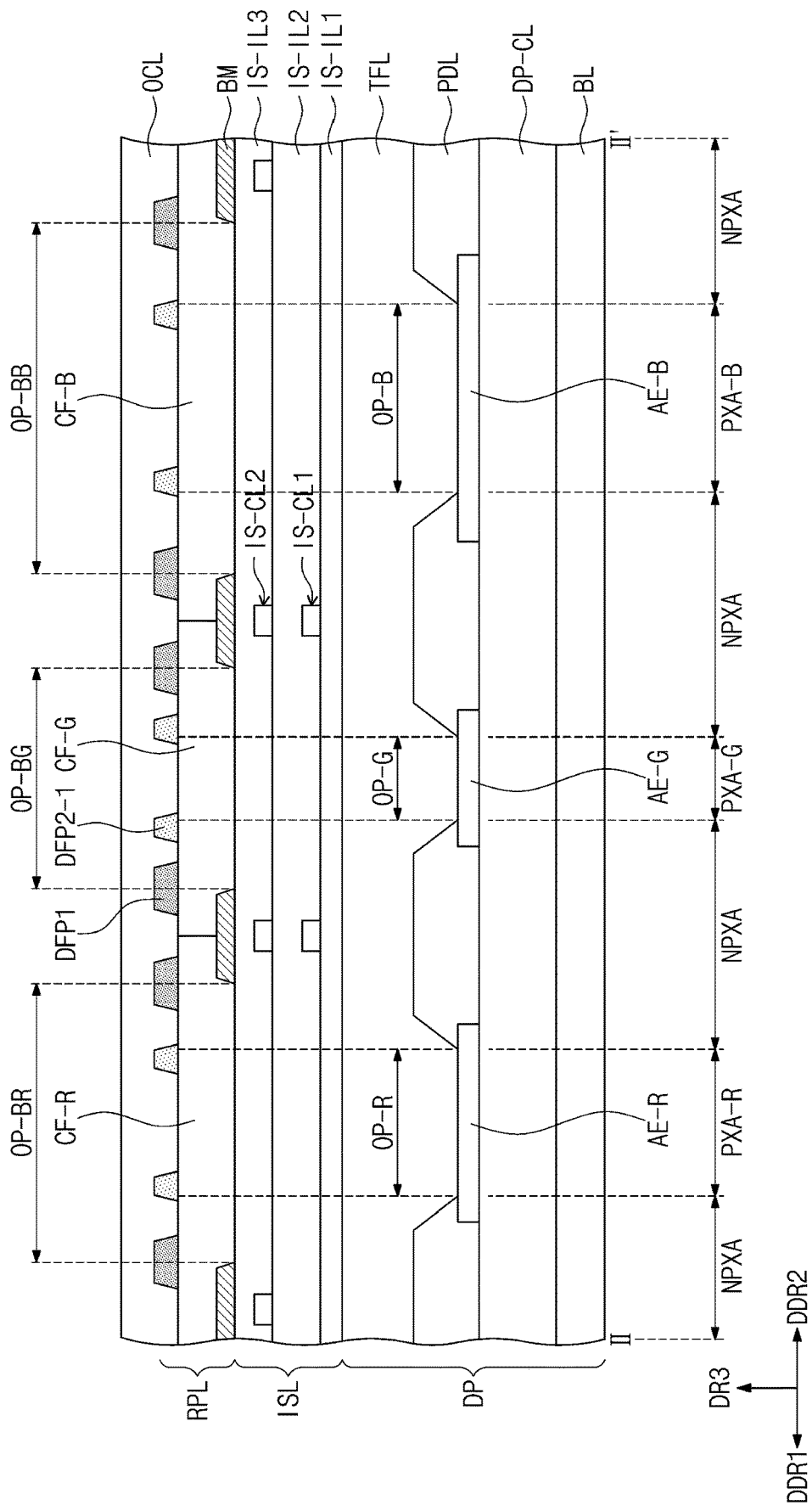
FIGS. 5D and 5E are cross-sectional views of embodiments of structures included in a display device.
Figure 5E:
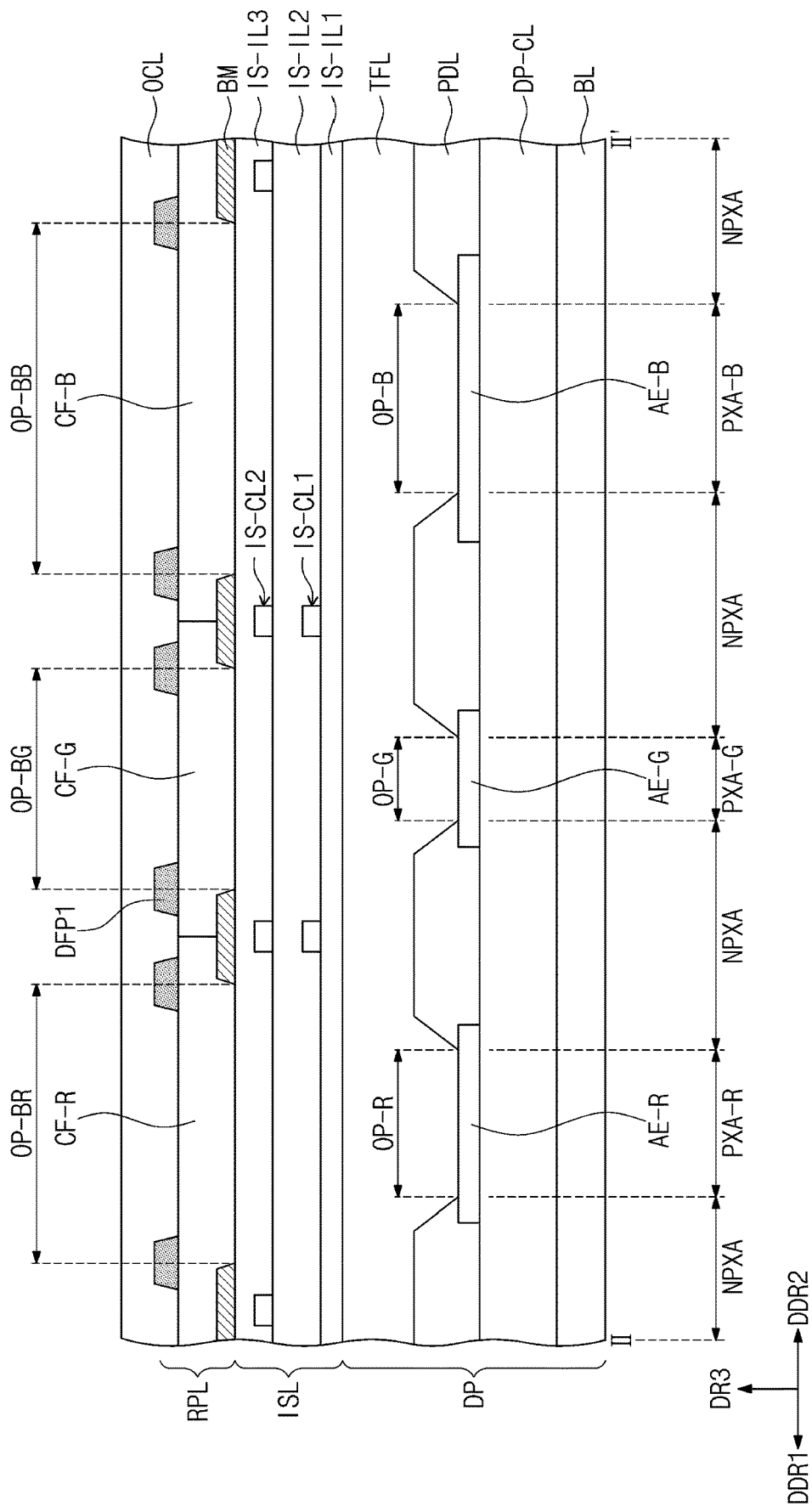

FIG. 5A is a cross-sectional view of embodiments of structures included in a display device DD. FIG. 5B is an enlarged cross-sectional view illustrating an embodiment of a portion of the structures illustrated in FIG. 5A. FIG. 5C is an enlarged plan view of an embodiment of a portion of a display device DD. FIGS. 5D and 5E are cross-sectional views of embodiments structures included in a display device DD. FIG. 5A illustrates a cross-sectional view taken along line II-IF of FIG. 3A. FIG. 5A simply illustrates a display panel DP, an input sensing layer ISL and a reflection preventing layer RPL which are sequentially stacked, and light-emitting regions PXA-R, PXA-G and PXA-B are mainly illustrated. In addition, FIGS. 5A and 5B illustrates an enlarged view of the display device DD illustrated in FIG. 2D. FIG. 5C illustrates an enlarged plan view of a portion of the display device DD illustrated in FIG. 5A. FIGS. 5D and 5E illustrate embodiments of protruding patterns in structures of the display device DD illustrated in FIG. 5A.

First electrodes AE-R, AE-B and AE-G respectively corresponding to a first color region PXA-R, a second color region PXA-B and a third color region PXA-G are disposed on the circuit element layer DP-CL. Light-emitting openings OP-R, OP-B and OP-G respectively corresponding to the first color region PXA-R, the second color region PXA-B and the third color region PXA-G are defined by solid portions of the pixel defining layer PDL. In FIG. 5A, remaining structures except for the first electrodes AE-R, AE-B and AE-G among the structures of the light-emitting element LED (see FIG. 4) are not illustrated for convenience of illustration.

Referring to FIG. 5A, the input sensing layer ISL may be disposed directly on the upper insulating layer TFL. The input sensing layer ISL may include a first sub-insulating layer IS-IL1, a first conductive layer IS-CL1, a second sub-insulating layer IS-IL2, a second conductive layer IS-CL2, and a third sub-insulating layer IS-IL3. In an embodiment, the first sub-insulating layer IS-IL1 and/or the third sub-insulating layer IS-IL3 may not be provided.

Each of the first conductive layer IS-CL1 and the second conductive layer IS-CL2 may have a single-layer structure or have a multi-layer structure along the third direction DR3. The multilayer-structure conductive layer may include at least two among transparent conductive layers and metal layers. The multilayer-structure conductive layer may include metal layers including mutually different metals. The transparent conductive layer may include indium tin oxide ("ITO"), indium zinc oxide ("IZO"), zinc oxide ("ZnO"), indium tin zinc oxide ("ITZO"), poly(3,4-ethylenedioxythiophene) ("PEDOT"), metal nanowires, or graphene. The metallic layer may include molybdenum, silver, titanium, copper, aluminum or an alloy thereof. In an embodiment, for example, the first conductive layer IS-CL1 and the second conductive layer IS-CL2 may each have three-layer metallic layer structure, for example, three-layer structure of titanium/aluminum/titanium. A metal having relatively high durability and low reflectivity may be applied to upper/lower layers, and a metal having high electrical conductivity may be applied to an inner layer.

The first conductive layer IS-CL1 and the second conductive layer IS-CL2 may include a conductive pattern provided in plural including a plurality of conductive patterns in a respective conductive layer. The first conductive layer IS-CL1 includes first conductive patterns and the second conductive layer IS-CL2 includes second conductive patterns. The first conductive patterns and the second conductive patterns may each include sensing electrodes and signal lines which are connected to the sensing electrodes. The first conductive patterns and the second conductive patterns may be disposed to respectively overlap a split pattern BM provided in plural including split patterns BM to be described later. The split patterns BM reduce or effectively prevent external light reflection caused by external light incident to the first conductive patterns and the second conductive patterns.

The first sub-insulating layer IS-IL1 to the third sub-insulating layers IS-IL3 may each include an inorganic film or an organic film. In an embodiment, the first sub-insulating layer IS-IL1 and/or the second sub-insulating layer IS-IL2 may be inorganic films. The third sub-insulating layer IS-IL3 may include an organic film.

The reflection preventing layer RPL may be disposed directly on the input sensing layer ISL. That is, the input sensing layer ISL is between the display panel DP and the reflection preventing layer RPL, and the light-blocking pattern (e.g., solid portion of a split member layer) contacts the input sensing layer ISL. The reflection preventing layer RPL may include a split pattern BM, a first color filter CF-R, a second color filter CF-B and a third color filter CF-G.

The split pattern BM overlaps or corresponds to the peripheral region NPXA. The split pattern BM is a pattern having a black color and may include a light-blocking pattern. In an embodiment, the split pattern BM may include a black coloring agent. The black coloring agent may include a black dye and/or a black pigment. The black coloring agent may include a metal such as carbon black or chromium, or an oxide thereof.

A first opening, a second opening and a third opening define filter openings OP-BR, OP-BB and OP-BG corresponding to light-emitting openings OP-R, OP-B and OP-G. The first opening, the second opening and the third opening are defined by solid portions of the split pattern layer (e.g., the split patterns BM). The planar areas of the filter openings OP-BR, OP-BB and OP-BG defined by the split patterns BM are greater than corresponding planar areas of the light-emitting openings OP-R, OP-B and OP-G of the pixel defining layer PDL. Centers of the filter openings OP-BR, OP-BB and OP-BG defined by the split patterns BM may be aligned with corresponding centers of the light-emitting openings OP-R, OP-B and OP-G of the pixel defining layer PDL.

The first color filter CF-R, the second color filter CF-B and the third color filter CF-G (e.g., together a color filter layer) respectively correspond to a first color region PXA-R, a second color region PXA-B and a third color region PXA-G. The first color filter CF-R transmits a first color light, that is, red light, the second color filter CF-B transmits a second color light, that is, blue light, and the third color filter CF-G transmits a third color light, that is, green light.

The first color filter CF-R, the second color filter CF-B and the third color filter CF-G may lower the reflectivity of external light. The first color filter CF-R, the second color filter CF-B and the third color filter CF-G may each transmit light having a specific wavelength range and absorb light having a wavelength range other than the specific wavelength range, and thus may transmit most of natural light incident from outside the display device DD and reflect only a portion of the natural light.

The first color filter CF-R, the second color filter CF-B and the third color filter CF-G may include a base resin and a dye and/or pigment which is dispersed in the base resin. The base resin is a medium in which dye and/or pigment is dispersed, and may be composed of various resin compositions that can be generally referred to as binders. Protruding patterns are disposed corresponding to the first color filter CF-R, the second color filter CF-B and the third color filter CF-G. The protruding patterns are disposed facing the first color filter CF-R, the second color filter CF-B and the third color filter CF-G so that at least a portion thereof is disposed to overlap the split pattern BM. The protruding patterns may be disposed to overlap at least a portion of the first color filter CF-R, the second color filter CF-B, and the third color filter CF-G. In an embodiment, a reflection preventing member (e.g., reflection preventing layer RPL or reflection preventing panel RPP) includes in order from the display panel DP, a light-blocking pattern (e.g., solid portions of the split pattern layer) corresponding to the peripheral region NPXA and defining an opening corresponding to the light-emitting region PXA, a color filter in the opening of the light-blocking pattern, and a protruding pattern corresponding to the light-blocking pattern, without being limited thereto.

As illustrated in FIG. 5A, the protruding patterns may each be a portion of a diffractive pattern DFP. The diffractive pattern DFP may be provided in plural including diffractive patterns DFP. The diffractive pattern DFP receives incident light and may diffract at least a portion of the incident light (e.g., external light) from outside the display device DD to define a diffractive pattern DFP. FIG. 5A illustrates that the diffractive patterns DFP are disposed on all of the first color filter CF-R, the second color filter CF-B and the third color filter CF-G, but the invention is not limited thereto, and the diffractive patterns DFP may be disposed on only one or two among the first color filter CF-R, the second color filter CF-B and the third color filter CF-G.

The reflection preventing layer RPL may include a protective layer OCL that covers the first color filter CF-R, the second color filter CF-B and the third color filter CF-G. The protective layer OCL may cover the diffractive patterns DFP which are protruded from the color filter layer in a direction away from the reflection preventing layer RPL. The protective layer OCL includes an organic material, and the protective layer OCL may provide a flat surface to planarize an underlying profile of the diffractive patterns DFP. In an embodiment, the protective layer OCL may be omitted.

A portion of the first color filter CF-R, a portion of the second color filter CF-B and a portion of the third color filter CF-G, which are disposed inside the peripheral region NPXA are disposed corresponding to the split pattern BM. In FIG. 5A, the split pattern BM is disposed under the first color filter CF-R, the second color filter CF-B and the third color filter CF-G, but the invention is not limited thereto. In an embodiment, the split pattern BM may be disposed above at least any one among the first color filter CF-R, the second color filter CF-B and the third color filter CF-G, and may also be disposed in a same layer as the first color filter CF-R, the second color filter CF-B and the third color filter CF-G. As being in a same layer, elements are respective patterns or portions of a same material layer or are disposed a same distance from a reference such as the panel base layer BL.

Referring to FIGS. 5A, 5B and 5C, the diffractive pattern DFP may be provided in plural including a first diffractive pattern DFP1 (e.g., first protruding pattern) and a second diffractive pattern DFP2 (e.g., second protruding pattern).

The first diffractive pattern DFP1 may overlap or correspond to the split pattern BM in a plan view along the third direction DR3. In a plan view, the first diffractive pattern DFP1 may extend from the split patterns BM to overlap the borders between the split pattern BM and respective ones of the filter openings OP-BR, OP-BB and OP-BG defined by the split patterns BM. In a plan view, the first diffractive pattern DFP1 may cover borders between the split pattern BM and respective ones of the filter openings OP-BR, OP-BB and OP-BG defined by the split patterns BM.

The second diffractive pattern DFP2 may overlap or correspond to the filter openings OP-BR, OP-BB and OP-BG defined by the split patterns BM in a plan view. That is, in a plan view, the second diffractive pattern DFP2 may be disposed in a planar area corresponding to a respective planar area of the filter openings OP-BR, OP-BB and OP-BG.

The second diffractive pattern DFP2 may include a first sub diffractive pattern DFP2-1 and a second sub diffractive pattern DFP2-2. The first sub diffractive pattern DFP2-1 may be extended from the light-emitting region PXA to the peripheral region NPXA and the second sub diffractive pattern DFP2-2 may correspond to the light-emitting region PXA and be further from the peripheral region NPXA than the first sub diffractive pattern DFP2-1.

At least a portion of the first sub diffractive pattern DFP2-1 may be disposed in the peripheral region NPXA in a plan view. At least a portion of the first sub diffractive pattern DFP2-1 may overlap, along the third direction DR3, a portion in which the peripheral region NPXA is defined, that is, a portion of the pixel defining layer PDL. The first sub diffractive pattern DFP2-1 may overlap the border between the pixel defining layer PDL and the light-emitting openings OP-R, OP-B and OP-G.

The second sub diffractive pattern DFP2-2 may be disposed at the center of the light-emitting regions PXA-R, PXA-G and PXA-B. The second sub diffractive pattern DFP2-2 may overlap or correspond to the center of the light-emitting openings OP-R, OP-B and OP-G along the third direction DR3. The second sub diffractive pattern DFP2-2 may overlap the center of the light-emitting openings OP-R, OP-B and OP-G defined by the pixel defining layer PDL.

The diffractive pattern DFP may function to diffract incident light from outside the display device DD and guide the light in directions towards the structures disposed below the diffractive pattern DFP and closer to the panel base layer BL. The diffractive pattern DFP may reduce or effectively prevent the incident light from the outside from being incident in the direction of the light-emitting openings OP-R, OP-B and OP-G. In an embodiment, for example, the light incident from the outside may be diffracted by the diffractive pattern DFP and guided in the direction toward the split pattern BM or solid portions of the pixel defining layer PDL. In an embodiment, the first diffractive pattern DFP1 may diffract the light incident from the outside and guide the light to the split pattern BM. The second diffractive pattern DFP2 may diffract the light incident from the outside and guide the light to the solid portions of the pixel defining layer PDL.

In an embodiment, the diffractive pattern DFP may have a trapezoidal shape in cross-section, having an upper surface which is furthest from the display panel DP and an inclined side surface extended from the upper surface toward the color filter layer. The external light incident in the direction to the inclined side surface of the diffractive pattern DFP is refracted and guided to the split pattern BM or solid portions of the pixel defining layer PDL. FIGS. 5A and 5B illustrates that the diffractive pattern DFP has a regular trapezoidal shape in which the upper surfaces are smaller than the lower surfaces opposite to the upper surfaces, but the invention is not limited thereto. In an embodiment, the diffractive pattern DFP may have a triangular shape in cross-section, and may have an inverted trapezoidal shape in which the upper surfaces are larger than the lower surfaces.

Each of the diffractive pattern DFP, the protective layer OCL and the color filters CF-R, CF-B and CF-G may have a refractive index. The refractive index of the diffractive pattern DFP may be greater than the refractive indexes of the protective layer OCL and the color filters CF-R, CF-B and CF-G. In an embodiment, the protective layer OCL and the color filters CF-R, CF-B and CF-G may have a refractive index equal to or greater than about 1.4 and less than about 1.6, and the diffractive pattern DFP may have a refractive index equal to or greater than about 1.6 and less than about 1.8. The diffractive pattern DFP may include an inorganic material or an organic material. The diffractive pattern DFP may include an inorganic material such as silicon oxide ($SiO_x$), silicon nitride ($SiN_x$), or silicon oxynitride $SiON_x$. Alternatively, the diffractive pattern DFP may include an organic material such as acryl-based or siloxane-based organic materials. However, the invention is not limited thereto, and any number of materials may be selected for the diffractive pattern DFP without limitation as long as the material has a higher refractive index than the refractive indexes of the protective layer OCL and the color filters CF-R, CF-B and CF-G.

In an embodiment, the diffractive pattern DFP may have a refractive index lower than the refractive indexes of the protective layer OCL and the color filters CF-R, CF-B and CF-G. When the diffractive pattern DFP has a refractive index lower than the refractive indexes of the protective layer OCL and the color filters CF-R, CF-B and CF-G, the diffractive patterns DFP may have an inverted trapezoidal shape in which the upper surfaces are larger than the lower surfaces in a cross-sectional view.

Each of the plurality of diffractive patterns DFP may be spaced apart from each other along the color filter layer by intervals defined therebetween. The first diffractive pattern DFP1 and the first sub diffractive pattern DFP2-1 may be spaced apart from each other by a first interval s1, and the first sub diffractive pattern DFP2-1 and the second sub diffractive pattern DFP2-2 may be spaced apart from each other by a second interval s2. In an embodiment, the first interval s1 and the second interval s2 may be substantially the same. In this specification, the wording "substantially the same" means that the numerical values of the intervals between structures, widths, and the like are not only exactly the same, but also the same within a range including a difference that may occur due to process error in providing or manufacturing the element, even under the same design. In an embodiment, the first interval s1 and the second interval s2 may be independently be about 1.5 to about 3.5 micrometers (μm) inclusive. The first interval s1 and the second interval s2 may be selected within a range in order to perform a function of diffracting external light by the diffractive pattern DFP without decreasing the transmittance at the light-emitting region.

The plurality of diffractive patterns DFP may each have a width along the color filter layer or along the plane defined by the first direction DR1 and the second direction DR2. The width of the diffractive pattern DFP may mean a distance extending along the first crossing direction DDR1 and/or the second crossing direction DDR2. In an embodiment, the first diffractive pattern DFP1 may have a first width w1, the first sub diffractive pattern DFP2-1 may have a second width w2, and the second sub diffractive pattern DFP2-2 may have a third width w3. In an embodiment, the second width w2 and the third width w3 may be substantially the same. The first width w1 may be greater than the second width w2 and/or the third width w3. In an embodiment, the first width w1 may be about 3.5 to about 5.5 μm inclusive. The second width w2 and the third width w3 may each be about 2 to about 4 μm inclusive. The first width w1, the second width w2, and the third width w3 may be defined within a range in order to perform a function of diffracting external light by the diffractive pattern DFP without decreasing the transmittance of the light-emitting region.

Referring to FIGS. 5A and 5C together, the first diffractive pattern DFP1 may have a belt shape that covers an entirety of a border of a third filter opening OP-BG in a plan view. In an embodiment, the border of the third filter opening OP-BG may be defined in a square shape in a plan view, and the first diffractive pattern DFP1 may have a square belt shape extended along the border of the third filter opening OP-BG in a plan view. The first sub diffractive pattern DFP2-1 in the second diffractive pattern DFP2 may have a belt shape that covers an entirety of a border of the third-color light-emitting region PXA-G in a plan view. In an embodiment, the border of the third-color light-emitting region PXA-G may be defined in a square shape in a plan view, and the first sub diffractive pattern DFP2-1 may have a square belt shape extended along the border of the third-color light-emitting region PXA-G in a plan view. The second sub diffractive pattern DFP2-2 in the second diffractive pattern DFP2 may be disposed corresponding to a center of the third-color light-emitting region PXA-G.

One or more embodiment of a display device DD includes a protruding pattern at least partially overlapping a light-blocking layer on a color filter layer, and in particular, includes a diffractive pattern DFP as a protruding pattern, and thus, the visibility of the display device DD may be improved by reducing external light reflection by structures within the display device DD. More specifically, the diffractive pattern DFP, which is provided on the color filter layer and overlaps solid portions of a split pattern layer, a filter opening layer and the like, diffracts external light, and causes the external light to be guided in the direction toward solid portions of the split pattern layer or solid portions of a pixel defining layer PDL including a light-shielding material. Thus, reflection of the external light by an electrode including a reflective material may be reduced or effectively prevented and the visibility of the image IM displayed by the display device DD may be improved.

Referring to FIG. 5D, in a display device DD, a diffractive pattern DFP includes a first diffractive pattern DFP1 and a first sub diffractive pattern DFP2-1, and a second sub diffractive pattern DFP2-2 may also be omitted. That is, the diffractive pattern DFP may only include a first diffractive pattern DFP1 that covers or corresponds to a respective border between the split pattern BM and a filter opening among the filter openings OP-BR, OP-BB and OP-BG in a plan view, and a first sub diffractive pattern DFP2-1 that covers or corresponds to a respective border between a solid portion of the pixel defining layer PDL and a light-emitting opening among the light-emitting openings OP-R, OP-B and OP-G.

Referring to FIG. 5E, in a display device DD, the diffractive pattern DFP includes a first diffractive pattern DFP1, and a second diffractive pattern DFP2 overlapping the filter openings OP-BR, OP-BB and OP-BG may be omitted. That is, the diffractive pattern DFP may include only the first diffractive pattern DFP1 that covers a respective border between the split pattern BM and a respective filter opening among the filter openings OP-BR, OP-BB and OP-BG in a plan view.

Figure 6A:
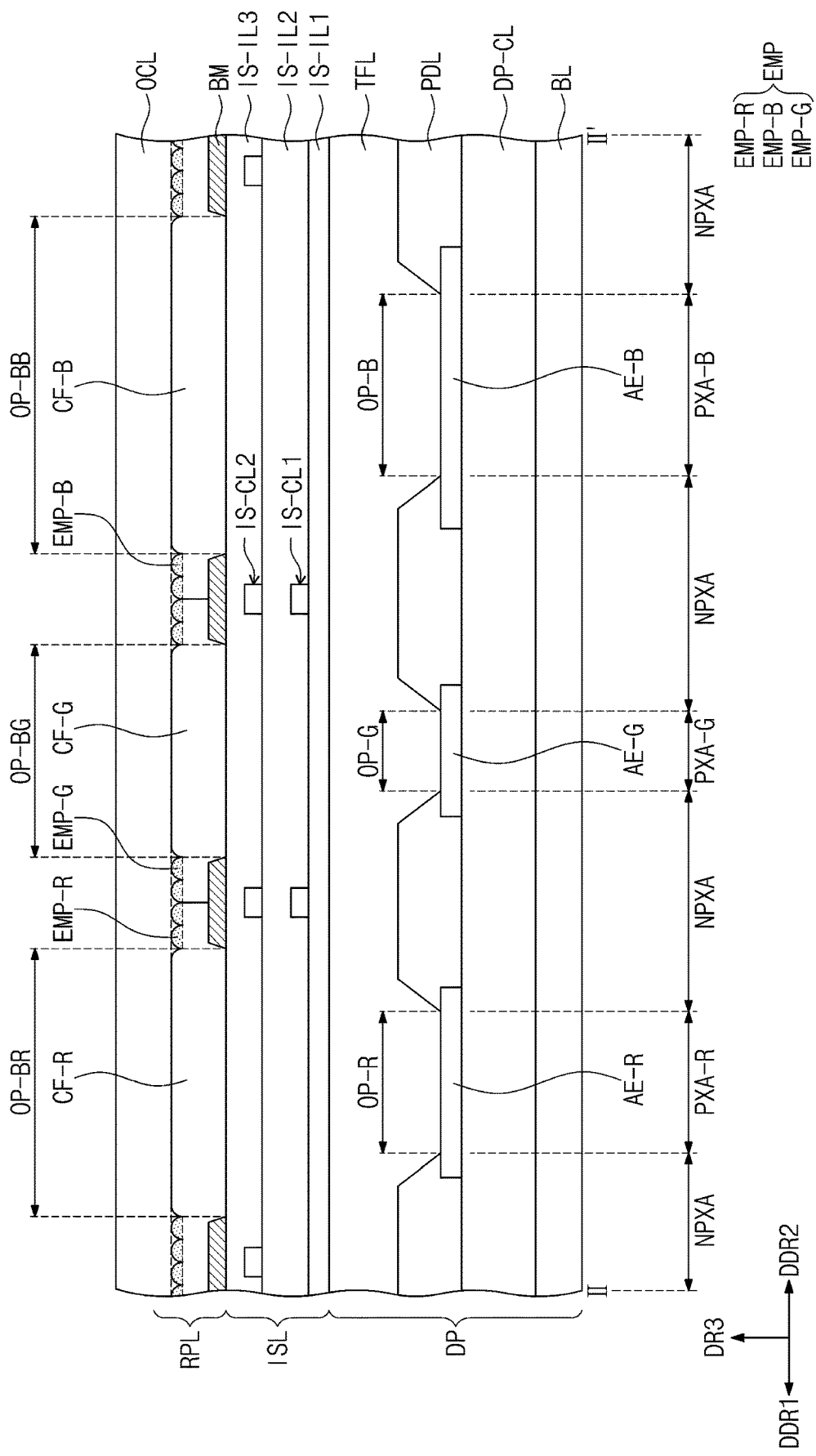
FIGS. 6A and 6B are cross-sectional views of embodiments of structures included in a display device.
Figure 6B:
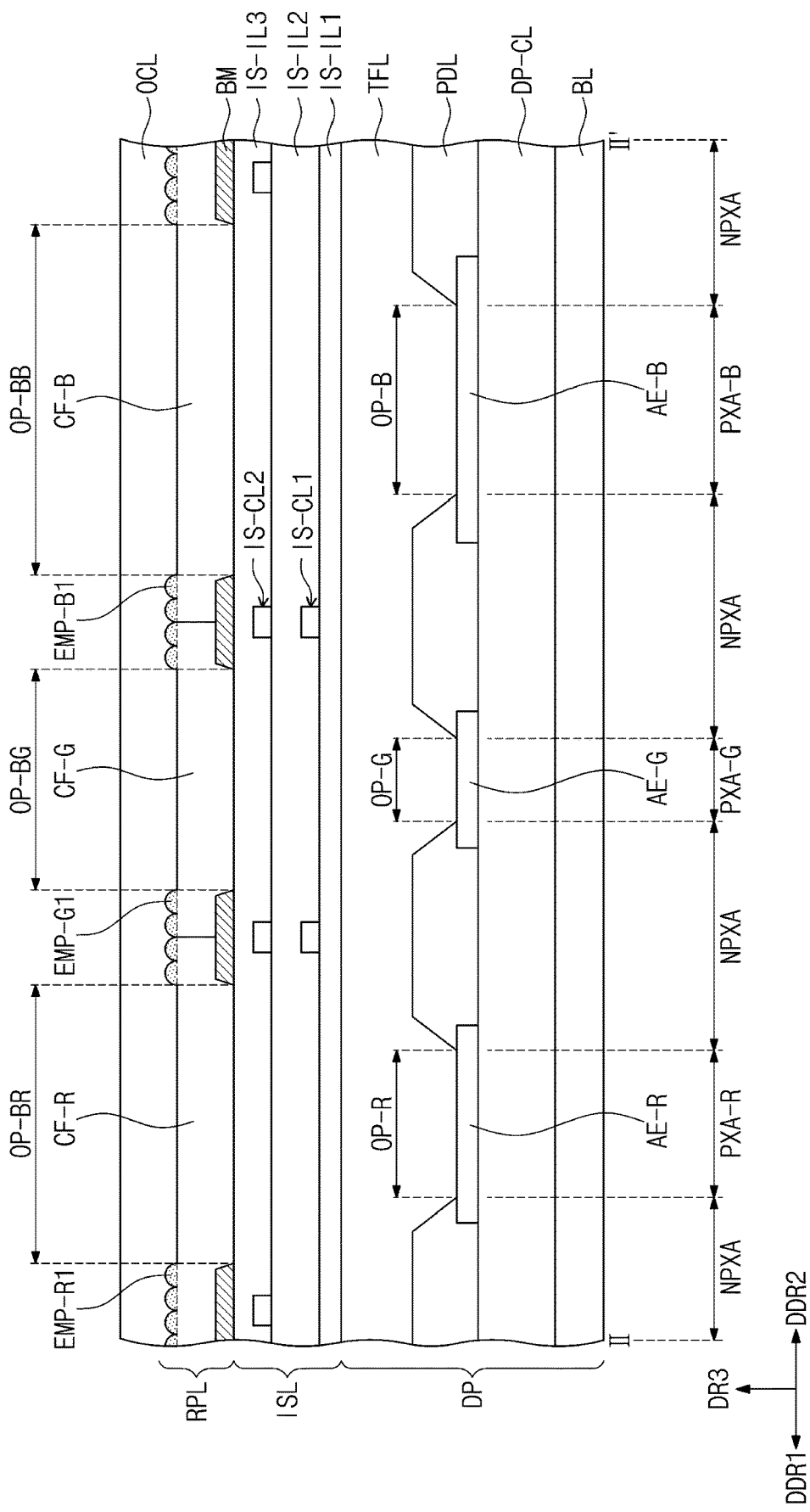
Figure 6C:
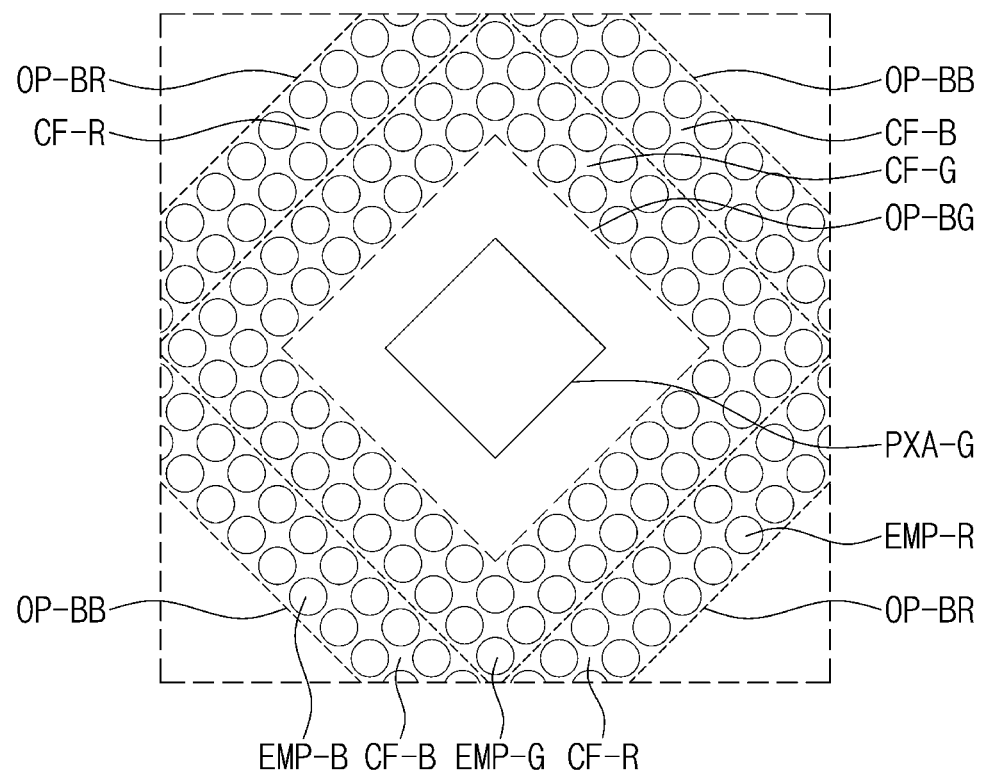
FIG. 6C is an enlarged plan view of an embodiment of a portion of a display device.

FIGS. 6A and 6B are cross-sectional views of embodiments of structures included in a display device DD. FIG. 6C is a plan view of an embodiment of a portion of a display device DD. FIGS. 6A and 6B illustrate embodiments including mutually different protruding patterns in structures of the display device DD illustrated in FIG. 5A. FIG. 6C illustrates an enlarged plan view of a portion with respect to the display device DD illustrated in FIG. 6A. Hereinafter, referring to FIGS. 6A to 6C, in describing a display device DD, the same reference symbols are applied to the same structure as the structure described above in FIGS. 5A to 5E, and detailed description thereon will be omitted.

Referring to FIGS. 6A and 6B, protruding patterns are disposed on a first color filter CF-R, a second color filter CF-B and a third color filter CF-G, and include an embossed pattern EMP provided in plural including embossed patterns EMP. The embossed patterns EMP may be patterns protruding from the color filters CF-B, CF-R and CF-G. More specifically, the embossed patterns EMP may be patterns having integrated shapes with the color filters CF-B, CF-R and CF-G and protruding along the thickness direction from interfaces between respective color filers among the color filters CF-B, CF-R and CF-G. The embossed patterns EMP may include the same material as a respective color filter among the color filters CF-B, CF-R and CF-G.

The embossed patterns EMP may include a first embossed pattern EMP-R provided in plural including first embossed patterns EMP-R disposed along the first color filter CF-R, a second embossed pattern EMP-B provided in plural including second embossed patterns EMP-B disposed along the second color filter CF-B, and a third embossed pattern EMP-G provided in plural including third embossed patterns EMP-G disposed along the third color filter CF-G. FIGS. 6A and 6B illustrate that the first color filter CF-R, the second color filter CF-B and the third color filter CF-G respectively include the first embossed pattern EMP-R, the second embossed pattern EMP-B and the third embossed pattern EMP-G, but the invention is not limited thereto. In an embodiment, at least any one among the first embossed patterns EMP-R, the second embossed patterns EMP-B and the third embossed patterns EMP-G may be omitted.

A portion of a respective color filter forms an interface with a solid portion of the split pattern layer. The portion of the respective color filter protrudes at multiple locations along the solid portion of the split pattern layer to provide a plurality of embossed patterns EMP of the respective color filter. That is, the plurality of embossed patterns EMP are integrated with the portion of the respective color filter forms the interface with a solid portion of the split pattern layer. The portion of the respective color filter is common to each of the plurality of embossed patterns EMP.

The embossed patterns EMP may be disposed to overlap the split pattern BM. The embossed patterns EMP may overlap at least a portion of the split pattern BM along the third direction DR3. FIGS. 6A and 6B illustrate that the embossed patterns EMP overlap an entirety of the split pattern BM, but the invention is not limited thereto. In an embodiment, the embossed patterns EMP may also be provided or formed so as to overlap only a portion of the split pattern BM, where the split pattern BM extends further than an edge of an outermost embossed pattern.

In an embodiment, the embossed patterns EMP may have shapes embedded in the direction toward the split pattern BM when compared with the upper surfaces of the color filters CF-B, CF-R and CF-G which are furthest from the panel base layer BL. In an embodiment, along a thickness direction of the display device DD, a portion of a respective color filter at a respective opening defines an upper surface of the respective color filter which is furthest from the display panel DP, and the protruding pattern is between the upper surface of the respective color filter and the light-blocking pattern.

More specifically, as illustrated in FIG. 6A, the embossed patterns EMP may each have a shape protruding from a reference surface (shown as dotted line in FIG. 6A). Along the third direction DR3, the reference surface is spaced apart from the upper surfaces of the color filters CF-B, CF-R and CF-G which correspond to the filter openings OP-BR, OP-BB and OP-BG, respectively. A distal end of the embossed patterns EMP which is furthest from a respective solid portion of the split pattern layer, may be coplanar with an upper surface of a corresponding color filter.

As illustrated in FIG. 6B, embossed patterns EMP-R1, EMP-B1 and EMP-G1 may each also have a shape protruding by a height with respect to the upper surface of color filters CF-B, CF-R and CF-G. An upper surface of a respective color filter is defined at a respective filter opening. The embossed patterns EMP-R1, EMP-B1 and EMP-G1 may each be protruded further than the upper surface. Distal ends of the embossed patterns EMP-R1, EMP-B1 and EMP-G1 are disposed further from the split pattern layer than the upper surfaces of the color filter layer. That is, the distal ends of the embossed patterns EMP-R1, EMP-B1 and EMP-G1 are not coplanar with the upper surfaces of the color filter layer.

A group of embossed patterns for a respective color filter may define an embossed pattern area. The embossed pattern area may be at opposing sides of the respective color filter, and a respective filter opening may be defined between the embossed pattern areas at the opposing sides.

The embossed patterns EMP may each have a semi-spherical shape. The embossed patterns EMP may each have a semi-circular shape in a cross-sectional view. The embossed patterns EMP may each have a semi-circular shape, refract incident light while having a predetermined angle, and redirect incident light in a direction away from the light-emitting openings OP-R, OP-B and OP-G. In an embodiment, for example, the embossed patterns EMP may refract the incident light and guide the light to propagate to the split pattern BM. In addition, the embossed patterns EMP may each have a semi-circular shape when viewed is a cross-sectional view and may decrease the amount of light reflected by the flat upper surfaces of the color filters CF-B, CF-R and CF-G which correspond to a respective filter opening. FIGS. 6A and 6B illustrate that the embossed patterns EMP each have a semi-circular shape in a cross-sectional view, but the invention is not limited thereto, and the embossed patterns EMP may each have various shapes without limited to a shape that may refract the light incident from the outside. In an embodiment, for example, the embossed pattern EMP may each have a rectangular shape with rounded corners.

Referring to FIGS. 6A and 6C, the embossed patterns EMP may be entirely disposed in the region defined between the filter openings OP-BG, OP-BB and OP-BR which are disposed adjacent to each other in a plan view. More specifically, a third embossed pattern EMP-G1 may be provided in plural including third embossed patterns EMP- G1 entirely disposed in remaining regions excluding regions overlapping the third filter opening OP-BG in the third color filter CF-G. Likewise, a first embossed pattern EMP-R1 may be provided in plural including first embossed patterns EMP-R1 entirely disposed in the remaining regions excluding regions overlapping a first filter opening OP-BR in the first color filter CF-R, and a second embossed pattern EMP-B1 may be provided in plural including second embossed patterns EMP-B1 entirely disposed in the remaining region excluding regions overlapping a second filter opening OP-BB in the second color filter CF-B.

One or more embodiment of a display device DD includes a protruding light-diffractive pattern provided in plural including protruding light-diffractive patterns at least partially overlapping solid portions (e.g., light-blocking patterns) of a split pattern layer on the color filter layer. In particular, as embossed patterns are included as the protruding light-diffractive patterns on respective color filters, the visibility of the display device DD may be improved by reducing external light reflection by structures in the display device DD. More specifically, the semi-circular embossed pattern, which protrudes further than the upper surface of the color filter layer or is embedded within a thickness of the color filter layer, refracts external light and causes the external light to be guided in the direction toward solid portions of the split pattern layer including a light-shielding material, or decreases the amount of external light reflected due to the flat upper surface of the color filter layer, and thus, the amount of external light reflected after being incident may be decreased, and visibility of the display device DD may be improved.

According to one or more embodiment, protruding light-diffractive patterns overlapping solid portions of a light-shielding material layer within a reflection preventing member may change the path of external light and reduce or effectively prevent the external light from being reflected by an electrode or the like including a reflective material. Thus, the light reflected to outside of the display device DD after being incident to the display device DD is decreased, and thus, visibility of the display device DD may be improved.

Heretofore, embodiments of the invention have been described, but it should be understood by those skilled in the art or those having common knowledge in the relevant technical field that various modifications and changes to the embodiments are encompassed without departing from the idea and technical range of the present disclosure. Hence, the real protective scope of the invention shall be determined by the technical scope of the accompanying claims.

What is claimed is:

1. A display device comprising:
   a display panel including a light-emitting region and a peripheral region which is adjacent to the light-emitting region; and
   a reflection preventing layer facing the display panel, the reflection preventing layer comprising in order from the display panel:
      a light-blocking pattern corresponding to the peripheral region and defining an opening corresponding to the light-emitting region;
      a color filter in the opening of the light-blocking pattern; and
      a protruding pattern provided in plural comprising:
         a first protruding pattern corresponding to the light-blocking pattern,
         a second protruding pattern corresponding to the opening,
         each single protruding pattern among the first protruding pattern and the second protruding pattern having a width at a bottom of the each single protruding patter, and
         the width of the first protruding pattern greater than the width of the second protruding pattern.

2. The display device of claim 1, wherein the protruding patterns receive external light from outside the display device and diffracts the external light toward the light-blocking pattern to define a diffractive pattern.

3. The display device of claim 2, wherein the diffractive pattern has a trapezoidal shape in cross-section.

4. The display device of claim 2, wherein
   the reflection preventing layer further comprises a protective layer facing the color filter with the diffractive pattern therebetween,
   each of the diffractive pattern and the protective layer has a refractive index, and
   the refractive index of the diffractive pattern is greater than the refractive index of the protective layer.

5. The display device of claim 1, wherein the second protruding pattern comprises:
   a first sub diffractive pattern extended from the light-emitting region to the peripheral region; and
   a second sub diffractive pattern corresponding to the light-emitting region and further from the peripheral region than the first sub diffractive pattern.

6. The display device of claim 5, wherein
   the first protruding pattern, the first sub diffractive pattern and the second sub diffractive pattern are spaced apart from each other by intervals, and
   an interval between the first sub diffractive pattern and the second sub diffractive pattern and an interval between the first sub diffractive pattern and the first protruding pattern are the same.

7. The display device of claim 1, wherein
   the light-blocking pattern and the opening has a border therebetween, and
   the first protruding pattern covers the border between the light-blocking pattern and the opening.

8. The display device of claim 1, further comprising an input sensing layer between the display panel and the reflection preventing layer,
   wherein the light-blocking pattern contacts the input sensing layer.

9. The display device of claim 1, wherein:
   the color filter extends from the light-emitting region and to the peripheral region to define a portion of the color filter in the peripheral region, and
   the portion of the color filter which in the peripheral region corresponds to both the light-blocking pattern and the protruding patterns.

10. The display device of claim 1, wherein further comprising a folding region including a folding axis about which the display device is foldable.

11. A display device comprising:
    a display panel comprising:
       a plurality of light-emitting regions defined by light-emitting elements which respectively emit different color lights, and
       a peripheral region adjacent to the plurality of light-emitting regions; and
    in order from the display panel:
       a light-blocking pattern defining openings respectively corresponding to the plurality of light-emitting regions;

a color filter layer comprising a plurality of color filters respectively in the openings, each of the plurality of color filters extended from a respective opening among the openings to define a portion of a respective color filter among the plurality of color filters which corresponds to the light-blocking pattern; and a pattern layer comprising a first protruding pattern corresponding to both the light-blocking pattern and the portion of the respective color filter, and a second protruding pattern which is adjacent to the first protruding pattern, wherein the light-blocking pattern forms a first border with the respective opening, a respective light-emitting region has a second border spaced apart from the first border, each of the first border and the second border extend in both a first direction and a second direction which crosses the first direction, the first border and the second border having a first planar shape and a second planar shape, respectively, and the first protruding pattern and the second protruding pattern overlap the first border having the first planar shape and the second border having the second planar shape, respectively.

12. The display device of claim 11, wherein the pattern layer further comprises a third protruding pattern further from the first protruding pattern than the second protruding pattern.

13. The display device of claim 12, wherein each of the first protruding pattern and the second protruding pattern has a closed shape, around the third protruding pattern.

* * * * *